(12) United States Patent
Iida et al.

(10) Patent No.: US 6,759,657 B2
(45) Date of Patent: Jul. 6, 2004

(54) INFRARED SENSOR

(75) Inventors: Yoshinori Iida, Tokyo (JP); Keitaro Shigenaka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 74 days.

(21) Appl. No.: 10/106,787

(22) Filed: Mar. 27, 2002

(65) Prior Publication Data

US 2002/0195563 A1 Dec. 26, 2002

(30) Foreign Application Priority Data

Mar. 27, 2001 (JP) .......................................... 2001-091173
Mar. 29, 2001 (JP) .......................................... 2001-095301

(51) Int. Cl.[7] .............................................. H01L 27/14
(52) U.S. Cl. ........................................ 250/332; 348/296
(58) Field of Search ................................ 250/332, 330, 250/208.1; 348/296, 301, 302, 280, 281, 275, 308

(56) References Cited

U.S. PATENT DOCUMENTS 6,163,061 A      12/2000   Iida
6,507,365 B1 *    1/2003   Nakamura et al. .......... 348/296
2001/0005227 A1 * 6/2001   Egawa et al. ............... 348/304

OTHER PUBLICATIONS

T. Ishikawa, et al., SPIE, vol. 3698, pps. 556–564, "Low-Cost 320×240 Uncooled IRFPA Using Conventional Silicon IC Process", Apr. 1999.

* cited by examiner

Primary Examiner—Constantine Hannaher
Assistant Examiner—Otilia Gabor
(74) Attorney, Agent, or Firm—Oblon, Spivak, McClelland, Maier & Neustadt, P.C.

(57) ABSTRACT

A low noise, high sensitivity and wide dynamic range uncooled type infrared sensor can effectively reduce the influence of fluctuations of the gate of the amplifier transistor. The infrared sensor comprises an imaging region containing thermoelectric conversion pixels arranged two-dimensionally in the form of a matrix of a plurality of row and a plurality of columns on a semiconductor substrate to detect incident infrared rays, column selection lines, vertical signal lines, said column selection lines and said vertical signal lines being arranged the imaging region, amplifier transistors configured to be modulated by the respective signal voltages generated in the signal lines, storage capacities connected respectively to the drains of the amplifier transistors and configured to store signal charges from the transistors, a plurality of reset circuits for resetting the drain potentials of said amplifier transistors and read circuits for reading the respective signal charges stored in said storage capacities, coupling capacitors being arranged between the vertical signal lines and the gate of amplifier transistors, sampling transistors being connected between the drains and the gates of said amplifier transistors.

12 Claims, 26 Drawing Sheets

INFRARED SENSOR

CROSS REFERENCE TO RELATED APPLICATIONS

This application is based upon and claims the benefits of priority from the prior Japanese Patent Applications No. 2000-91173 filed on Mar. 27, 2001 and No. 2001-95301 filed on Mar. 29, 2001, the entire contents of which are incorporated herein by reference.

BACKGROUND OF THE INVENTION

This invention relates to an infrared sensor and, more particularly, it relates to a signal read circuit of a thermal type infrared sensor.

The technology of infrared imaging can find a broad scope of application because images can be picked up regardless of day or night even through smoke and fog to provide a great advantage over visible light imaging. Additionally, infrared imaging can obtain thermal information on the object of imaging. The broad scope of application of infrared imaging covers military defense devices, monitor cameras and fire detection cameras.

In recent years, massive efforts have been paid for developing no cooling thermal type infrared solid state imaging devices that do not require the use of a cooling mechanism for low temperature operations because the need of using a cooling mechanism is the largest problem of quantum type infrared solid state imaging devices that have been in the main stream. Thermal type infrared solid state imaging devices are so designed that the incoming infrared rays with a wavelength of about 10 ìm are transformed into heat by means of an IR rays absorption system and the temperature change of the heat sensing section produced by the weak heat is converted into an electric signal by means of a thermoelectric converter. Then, infrared image information can be obtained by reading the electric signal.

Thermal type infrared solid state imaging devices realized by forming silicon pn junctions for converting a temperature change into a voltage change by means of a constant forward electric current in an SOI (silicon on insulator) region have been reported (Tomohiro Ishikawa, et al., Proc. SPIE Vol. 3698, p 556, 1999).

Silicon pn junction type devices using an SOI substrate provide an advantage that they can be manufactured by using only a silicon LSI manufacturing process and hence are highly adapted to mass production.

Another advantage of silicon pn junction type devices is that the pn junctions that operate as thermoelectric conversion means have a pixel selecting function of utilizing the current rectifying ability of pn junctions and therefore it is possible to simplify the internal structure of pixels.

Meanwhile, the temperature change in the pixel section of a thermal type infrared solid state imaging device is generally about $5 \times 10^{-3}$ times of the temperature change of the object of imaging although it may vary depending on the absorption coefficient of the infrared rays absorption layer and the performance of the optical system. In other words, when the temperature of the object of imaging changes by 1[K], the pixel temperature changes by 5[mK].

When eight silicon pn junctions are connected in series to a single pixel, the thermoelectric conversion efficiency is in the order of about 10 [mV/K]. Therefore, when the temperature of the object of imaging changes by 1[K], a signal voltage of 50 [ìV] is generated in the pixel section.

In reality, the thermal type infrared solid state imaging device is required to detect a temperature change of about 0.1 [K]. Then, it has to read a generated voltage signal of about 5 [ìV].

As means for reading such a very weak signal voltage, a circuit adapted to amplify the generated signal voltage as the gate voltage of a MOS amplifier transistor for amplifying the electric current and integrate the amplified current with time by means of a storage capacitor is known.

Such a circuit is referred to as gate modulation integration circuit. An effect of limiting the signal bandwidth and reducing the random noise can be achieved by arranging such a circuit as column amplifying circuit in each column of a matrix for the purpose of parallel amplification of the electric current of a row.

The voltage gain: G of a gate modulation integration circuit is determined by the mutual conductance of the amplifier transistor:gm=åId/åVg, the integration time:ti and the storage capacity Ci and expressed by G=(ti×gm)/Ci. When the integration time:ti and the storage capacity:Ci are given, the gain is dominated by the mutual conductance:gm of the amplifier transistor. The value of gm is approximately expressed by formula (1) below when an n-type MOS transistor operates in a saturation region;

$$gm=(W/L)\cdot(åox/Tox)\cdot in\cdot(Vgs-Vth) \quad (1),$$

where W: channel width,

L: channel length,

åox: dielectric constant of gate oxide film,

Tox: film thickness of gate oxide film,

ìn: electron mobility,

Vgs: gate/source voltage and

Vth: threshold voltage of transistor.

As pointed out above, a thermal type infrared solid state imaging device is required to detect a temperature change of about 0.1[K] in the temperature of the object of imaging. Therefore, it is necessary to read a signal of about 5 [ìV] that is generated in the pixel section. This voltage level is very low if compared with a CMOS sensor that is used to obtain an image by means of visible light. According to Nakamura and Matsunaga, "High Sensitivity Image Sensor", the Journal of the Institute of Image Information and Television Engineers, Vol. 54, No. 2, p. 216, 2000, the noise voltage is about 0.4 [mV]=400 [ìV]. In view of this noise level, the noise level of the above infrared solid state imaging device is as low as about 1/80 of that of a CMOS sensor and hence the signal voltage the former deals is as low as about 1/80 of that of the latter.

Therefore, if the sensor output is processed by means of a circuit similar to a circuit to be for processing the output of a CMOS sensor that is a typical imaging device, a column amplifier comprising gate modulation integration circuits and showing a gain of about 80 times will be required.

However, a variance greater than the pixel output of about 5 [ìV] is found at the gate of the amplifier transistor of a gate modulation integration circuit and hence such a circuit needs to be designed with a relatively low gain. The variance is attributable to the variance of the threshold voltage of the MOS amplifier transistors and that of the threshold of the load MOS transistors to be used as constant current source and it is known that both show an amplitude of about 30 [mV].

The amplitude of the fluctuations of the threshold voltage means that the storage capacity can show fluctuations of about 2.4[V] when an about 80 times greater gain is used as design value because the fluctuations are amplified by the amplifier/read circuit like the pixel output signal applied as the gate voltage of the amplifier transistor. Of course, the fluctuations of the thresholds are specific to the individual MOS amplifier transistors and the individual load MOS transistors and a fixed pattern appears in the picked up image so that the obtained image can be corrected by means of an external circuit. However, such corrections use most of the voltage swing of the storage capacitor and expand the dynamic range that the external circuit is required to show.

Therefore, until now, the load applied to the external circuit has to be inevitably reduced at the cost of the gain of the amplifier/read circuit. Furthermore, it has not been possible to sufficiently suppress random noises such as current shot noises and 1/f noises of the amplifier/read circuit in order to secure a large gain.

Additionally, in many cases, an electric current has to be made to flow to the thermoelectric converter of the thermal type infrared sensor in order to read the thermal information of the thermoelectric converter as electric signal. Then, a so-called self heating problem arises because Joule's heat is generated due to the bias current or the bias voltage to be used for reading the thermal information and the generated Jole's heat by turn heats the thermoelectric converter.

For instance, when thermoelectric conversion pixels are mounted onto a semiconductor substrate and the general value of $10^{-7}$ [W/K] is selected for the thermal conductance between the semiconductor substrate and the pn junction type thermoelectric converter, the influence of self heating of the converter will be a temperature rise of about 30[K] if computed on an assumption that the number of pn junctions is eight, the bias current is 200 [ìA], the pixel selection period for signal reading is 25 [ìs] and the frame rate is 60 [fps]. The importance of solving the problem of self heating will be realized if the above value is compared with the pixel temperature rise of 5 [mK] due to the received infrared rays described earlier.

FIG. 26 of the accompanying drawings schematically illustrates the temperature change (in terms of voltage Vsig) of a pixel due to self heating. As shown, the pixel temperature rises rapidly as the pixel is selected in a row selection period and falls gradually after the pixel selection pulse becomes off due to the thermal time constant of the thermoelectric converter.

Thus, the temperature change due to self heating is 30[k] according to the above computation while the temperature signal generated by the incoming infrared rays that give rise to a temperature change of only about 5 [mK] is smaller than the height of the solid line in FIG. 26. Thus, in the case of an ordinary column amplifier connected to a signal line, a weak electric current flows in the initial stages of pixel selection and the signal current increases with time due to self heating during the pixel selecting operation. Additionally, the electric current is almost totally occupied by the temperature information current produced by the self heating, which is a mere noise current.

FIG. 27 of the accompanying drawings schematically illustrates the integrated and stored electric charge in a storage capacitor that is depicted as a potential well and located at the output side of the column amplifier. As seen from FIG. 27, the stored electric charge is mostly the electric charge QSH that is attributable to self heating and the signal charge Qsig is only a minor part thereof.

FIG. 27 also shows that the electric current generated in a latter half of the row selection period becomes relatively large as a result of the temperature change caused by self heating and consequently the information obtained in the latter half and in the final stages of the row selection period is weighted. Then, as a matter of course, the effective sampling period is curtailed to expand the signal bandwidth and increase random noise.

X. Gu, et al. reports a method for avoiding the problem of self heating by forming a bridge circuit, using a bolometer operating on the principle of temperature change of electric resistance (X. Gu, et al., Sensors and Actuators A, Vol. 69, p. 92, 1998).

The authors of the above document formed a bridge circuit to realize differential amplification by arranging an insensitive reference pixel having a heat capacitance same as that of the ordinary pixels and showing a low thermal resistance at each column.

This is a method utilizing the fact that the temperature rise due to self heating in the row selection period that is very short relative to the thermal time constant is mainly governed by the heat capacitance.

However, while this method is effective for reducing the influence of self heating, it is an approximate solution to the problem of self heating and does not completely dissolve the self heating problem.

Insensitive reference pixels have to be provided on a one to one basis relative to the sensitive pixels for the purpose of completely dissolving the self heating problem in a rigorous sense of the words. However, no image sensor having a layout of arranging pixels two-dimensionally has ever been realized to date.

This is because, when an insensitive reference pixel is provided for each ordinary pixel in order to form a bridge circuit, there arises a disadvantage that the sensitivity of the image sensor is reduced to less than a half if the pixel size of the reference pixel is same as that of an ordinary pixel. Therefore the effect of dissolving the problem of self heating is offset by this disadvantage and hence such a technique of canceling self heating by means of a bridge circuit may not be effective.

In view of the above identified circumstances, it is therefore an object of the present invention to provide a low noise, high sensitivity and wide dynamic range uncooled type infrared sensor that can effectively reduce the influence of fluctuations of the gate of the amplifier transistor and a method of driving such an infrared sensor.

The self heating problem of pn junction type infrared sensors comprising thermoelectric conversion pixels having a column amplifier has not been dissolved in the technological field of the present invention. Therefore, another object of the present invention is to solve this problem.

BRIEF SUMMARY OF THE INVENTION

In an aspect of the present invention, there is provided an infrared sensor comprising:

an imaging region containing thermoelectric conversion pixels arranged two-dimensionally in the form of a matrix of a plurality of row and a plurality of columns on a semiconductor substrate to detect incident infrared rays;

a plurality of row selection lines arranged in the column direction in the imaging region;

a plurality of signal lines arranged in the row direction in said imaging region;

a plurality of amplifier transistors having respective gates connected to said signal lines and configured to be modulated by the respective signal voltages generated in the signal lines;

a plurality of storage capacities connected respectively to the drains of the amplifier transistors and configured to store signal charges from the transistors;

a plurality of reset circuits connected to the respective drains of said amplifiers to reset the drain potentials of said amplifier transistors and make them show a predetermined potential;

a plurality of read circuits for reading the respective signal charges stored in said storage capacities;

a plurality of coupling capacities arranged respectively between said signal lines and the gates of said amplifier transistors; and a plurality of sampling transistors connected respectively between the drains and the gates of said amplifier transistors to selectively turning them on to apply the threshold information of said transistors to the gates.

Some of modes of carrying out the invention includes the following.

(1) Each of the thermoelectric conversion pixels comprises an infrared absorbing section for absorbing infrared rays striking the semiconductor substrate and converting them into heat; a thermoelectric conversion section for converting the temperature change produced by the heat generated in the infrared absorbing section into an electric signal, a pixel selection circuit for selecting a pixel to be used for reading the pixel output signal from the thermoelectric conversion section and an output circuit for outputting the pixel output signal from the selected thermoelectric conversion pixel.

(2) The semiconductor substrate is an SOI substrate SOI formed by laying an SOI single crystal silicon layer on a single crystal silicon supporting substrate by way of a silicon oxide layer and the thermoelectric conversion means comprises single crystal silicon pn junctions formed by arranging second conductivity type regions in the inside of the first conductivity type SOI single crystal silicon layer and supported on the cavities of the cavity structure formed in the inside of the SOI substrate.

(3) The imaging region contains at least a row of insensitive pixels showing no sensitivity relative to incident infrared rays and hence being not apt to change any pixel output signal by incident infrared rays, said insensitive pixels being arranged in the row direction.

(4) The insensitive pixels are made insensitive as the thermoelectric conversion means is not thermally separated from the semiconductor substrate.

(5) The infrared sensor further comprises a storage means for storing a first group of pieces of row output information obtained from the read means on a time series basis and a correction means for correcting a second group of pieces of row optical information obtained by selecting a row different from the row used for obtaining the first group of pieces of row output information.

An infrared sensor having the above configuration is typically driven in a manner as described below. During a non-selection period when any of said thermoelectric conversion pixels is selected by means of said row selection lines in a single frame period, the drain potentials of the amplifier transistors are held in an unreset state by turning off said reset means and the drains and the gates of the transistors are connected and made to show a same potential by turning on said sampling transistors in the first period of the non-selection period. In a second period of said non-selection period not including the first period, the drains and the gates of the sampling transistors are separated form each other by turning off said sampling transistors and the gates of said amplifier transistors are made to hold the drain potentials of the respective transistors obtained in the first period. During a selection period for selecting a thermoelectric conversion pixel by means of said row selection lines and a period for reading the signal voltages by said read means, the sampling transistors are held to an off state.

An infrared sensor comprising an insensitive pixel row is typically driven in a manner as described below.

During a first selection period when the insensitive pixel row is selected by means of said row selection lines, the drain potentials of the drains of said amplifier transistors are held to an unreset state by turning off said reset means and the drains and the gates of said sampling transistors are connected and made to show a same electric potential by turning on said sampling transistor to apply a first source voltage to the sources of said amplifier transistors in a first period of said first selection period. In a second period of said selection period not including the first period, the drains and the gates of the sampling transistors are separated form each other by turning off said sampling transistors and the gates of said amplifier transistors are made to hold the drain potentials of the respective transistors obtained in the first period. During a second selection period for selecting a sensitive pixel row by means of said row selection lines in a single frame period, said sampling transistors are held to an off state and a second source voltage different from the first source voltage is applied to the sources of said amplifier transistors. In a period for reading the signal voltage of the selected amplifier transistor by means of said row selection lines by said read means, said sampling transistors are held to an off state and the first source voltage is applied to the sources of said sampling transistor.

Thus, according to the present invention, the signal lines where the pixel output appears and the gates of the amplifier transistors are separated from each other DC-wise by arranging coupling capacitors between them and each frame is made to hold the threshold information of the amplifier transistors of each column in the gates of the amplifier transistors in order to eliminate any variance among the voltage gains of the columns that can be produced as a result of fluctuations of the threshold value of the amplifier transistors, which may vary from column to column. Thus, the influence of fluctuations of the threshold value of each column can be eliminated to make it no longer necessary to provide a margin for the operating voltage region of the storage capacitors for the purpose of coping with such fluctuations and securing a voltage swing of the storage capacitors. Therefore, according to the invention, it is possible to design a large gain for the gate modulation integration circuit so that a highly sensitive uncooled type infrared sensor can be realized. Additionally, the potential of the storage capacitor can be fully exploited for the same reason to make it possible to provide a uncooled type infrared sensor having a wide dynamic range.

Thus, according to the invention, fluctuations of the threshold voltage of the amplifier transistors and the variance of operation point are corrected at the same time by sampling the threshold information of the amplifier transistors of each column and also the threshold information of the load MOS transistors of each column simultaneously at a timing when an insensitive pixel voltage is generated in the signal lines at the time of selecting an insensitive pixel that contains threshold information of the load MOS transistors. Thus, the influence of fluctuations of the threshold voltage of the load MOS transistors of each column can be eliminated to make it no longer necessary to provide a margin for the operating voltage region of the storage capacitors for the purpose of coping with such fluctuations and securing a voltage swing of the storage capacitors. Therefore, according to the invention, it is possible to design a large gain for the gate modulation integration circuit so that a highly sensitive uncooled type infrared sensor can be realized. Additionally, the potential of the storage capacitor can be fully exploited for the same reason to make it possible to provide an uncooled type infrared sensor having a wide dynamic range.

Instill another aspect of the invention, there is provided an infrared sensor comprising:

a plurality of thermoelectric conversion pixels arranged in the form of a matrix of a plurality of rows and a plurality of columns and configured to thermoelectrically transform the heat generated as a result of absorbing incident infrared rays and take it out as a change in the resistance;

a plurality of selection lines connected respectively to either the rows or the columns of said thermoelectric conversion pixels;

a plurality of signal lines connected respectively to either the columns or the rows, whichever appropriate, of said thermoelectric conversion pixels;

a pixel selection circuit for selectively applying a read voltage to said thermoelectric conversion pixels connected to said the selection lines on a selection line by selection line basis and causing said signal lines to generate a voltage output signal;

an output signal amplifying circuit having a first input section and a second input section, said first input section being connected to said signal lines, and configured to amplify the voltage output signal from said thermoelectric conversion pixels; and a compensation voltage applying circuit connected to the second input section of said output signal amplifying means and applying a waveform voltage for canceling or reducing the voltage component contained in said voltage signal due to the resistance change component attributable to the self heating produced in said thermoelectric conversion pixels by said read current in synchronism with said read voltage.

With an infrared sensor in this aspect of the invention, a ramp or step waveform voltage that is synchronized with the pixel selection pulse is applied to the sources of the amplifying MOS transistors of the amplifying circuit to whose gates the voltage signal is input from the thermoelectric conversion section in order dissolve the self heating problem of the thermoelectric conversion section of a thermal type infrared sensor according to the invention that is attributable to the Joule's heat generated as a result of pixel selection. As a result, the voltage attributable to self heating can be removed from the gate/source voltage:Vgs of the amplifier transistors to realize a low noise, high sensitivity and wide dynamic range uncooled type infrared sensor.

Additionally, according to the invention, it is possible to provide an insensitive pixel column formed by arranging a heat isolation insensitive pixel on each row. It is then possible to remove the voltage attributable to self heating from the gate/source voltage:Vgs of the amplifier transistors by applying a voltage produced by referring to the output voltage of the insensitive pixel column to the sources of said amplifier transistors as in the case of applying a ramp waveform voltage. Thus, it is also possible to realize a low noise, high sensitivity and wide dynamic range uncooled type infrared sensor.

DETAILED DESCRIPTION OF THE INVENTION (1st Embodiment)

Figure 1:
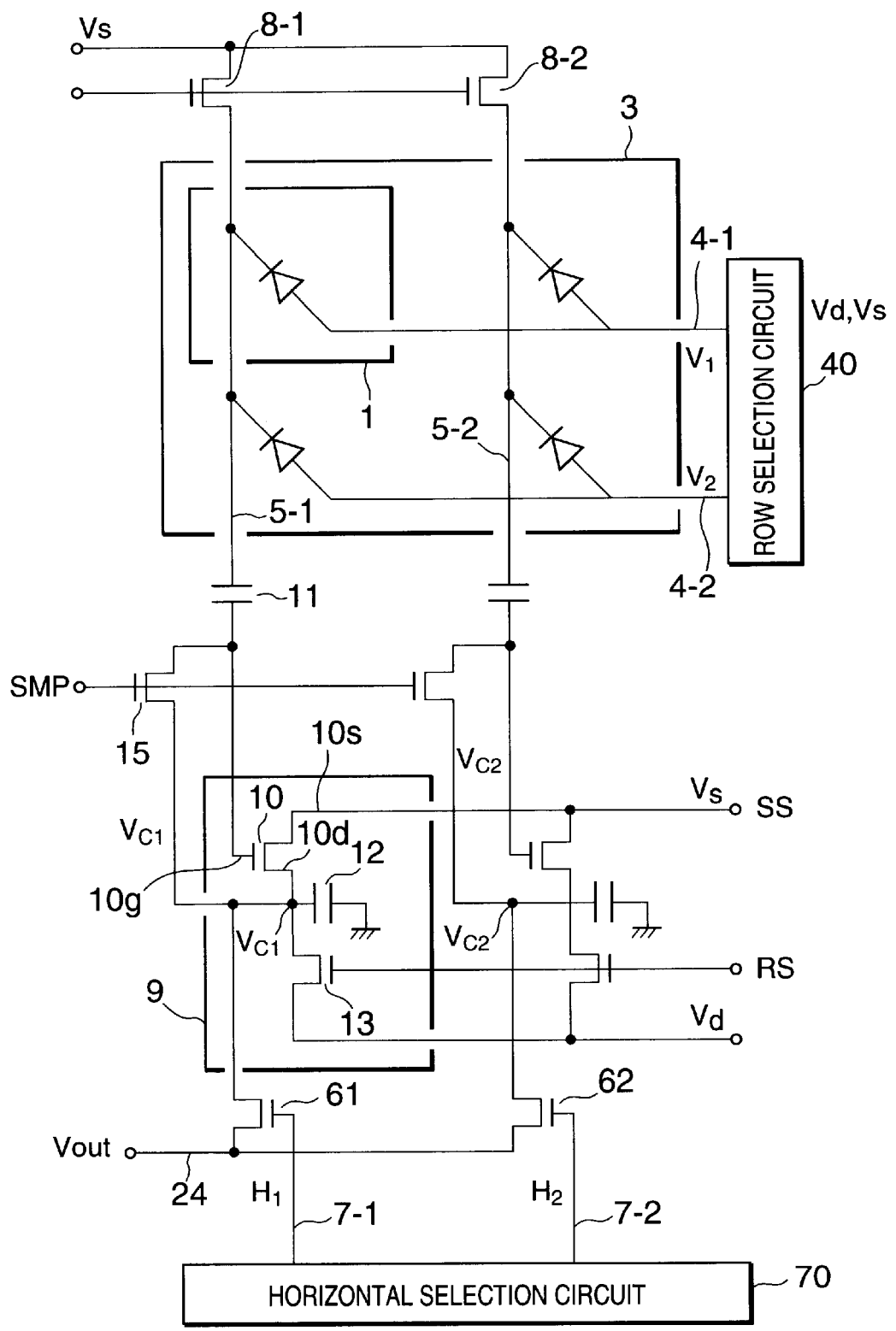
FIG. 1 is a schematic circuit diagram of the first embodiment of infrared sensor according to the invention, illustrating its entire configuration.

FIG. 1 is a schematic circuit diagram of the first embodiment of infrared sensor according to the invention, illustrating its entire configuration. While pixels are arranged in two rows and two columns in FIG. 1 for the purpose of simplification, it may be needless to say that the embodiment can comprise more pixels arranged in the form of a matrix of m rows and n columns.

Thermoelectric conversion pixels 1 for converting incoming infrared rays into an electric signal are arranged two-dimensionally on a semiconductor substrate to form an imaging region 3. A plurality of row selection lines 4 (4-1, 4-2) and a plurality of vertical signal lines 5 (5-1, 5-2) are arranged in the inside or the imaging region 3.

A row selection circuit 40 and a horizontal (column) selection circuit 70 to be used for the purpose of pixel selection are arranged respectively in the row direction and in the column direction in the imaging region 3. The row selection lines 4 are connected to the row selection circuit 40 while horizontal selection transistors 61, 62 are connected to the horizontal selection circuit 70 by way of respective horizontal selection lines(7-1, 7-2). Load MoS transistors 8 (8-1, 8-2) are connected respectively to the vertical signal lines of the different columns as constant current sources in order to obtain a pixel output voltage. Substrate voltage Vs is applied to the sources of the load MOS transistors 8.

Supply voltage Vd is applied to the row selection line 4 selected by the row selection circuit 40 while the substrate voltage Vs is applied to the unselected row selection line 4. As a result, the pn junction located in the inside of the thermoelectric conversion pixel 1 of the selected row is forwardly biased and a bias current flows to it so that the operation point is determined by the temperature of the pn junction in the pixel and the forward bias current to generate a pixel signal output voltage in the vertical signal line 5 of each column. At this time, the pn junction of the pixel 1 not selected by the row selection circuit 40 is reversely biased. Thus, the pn junction in the inside of each pixel has a pixel selecting function.

The voltage generated in the vertical signal lines 5 is a very low voltage. Assume that the ratio of the temperature change of the object of imaging is dTs to the temperature change of the pixel dTd is $5 \times 10^{-3}$. Then, it will be appreciated that the voltage generated in the vertical signal lines 5 is as low as 5 [iV] form this value and the thermoelectric conversion sensitivity dV/dTd=10 [mV/K] that is obtained when the eight pn junctions of the pixels are connected in series. Therefore, in order to recognize this temperature difference on the object of imaging, the noise that is generated in the vertical signal lines 5 needs to be made lower than 5 [iV]. This noise level is as low as about 1/80 of the noise of a CMOS sensor that is used for a MOS type visible light image sensor.

An amplifying/read circuit 9 is provided for each column and the gate 10g of the amplifier transistor 10 of each column and the vertical signal line 5 of the column are capacitively coupled to each other by a coupling capacitor 11 in order to amplify this low signal voltage. The vertical signal line 5 and the amplifying/read circuit 9 are isolated DC-wise from each other by the coupling capacitor 11.

A storage capacitor 12 is connected to the drain 10d side of the amplifier transistor 10 for integrating and storing the amplified signal current. The storage time for integrating the signal current is determined by the row select pulse applied to the row selection lines 4 by the row selection circuit 40. A reset transistor 13 for resetting the voltage of the storage capacitor 12 is connected to the storage capacitor 12 so that the storage capacitor 12 is reset by the voltage applied to the gate RS after the completion of the operation by the horizontal selection transistor 61 of reading the signal voltage.

The drain 10d of the amplifier transistor 10 is connected to the gate of the amplifier transistor 10 by way of sampling transistor 15 so that the gate 10g and the drain 10d of the amplifier transistor 10 shows a same potential when the sampling transistor 15 is turned on.

Figure 2A:
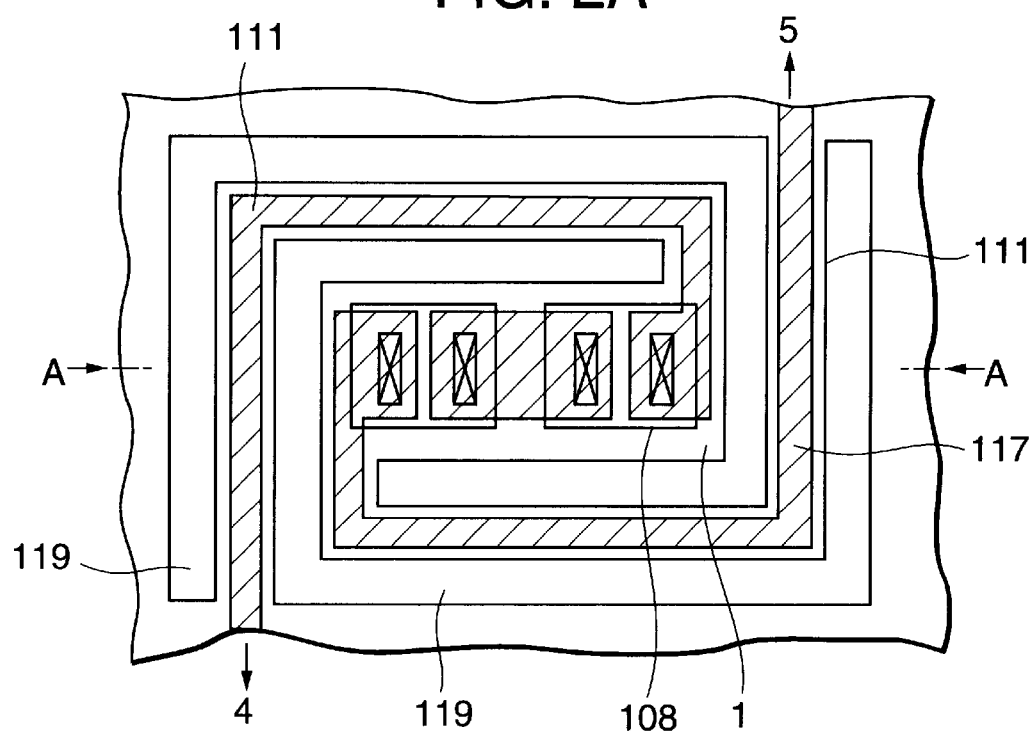
FIG. 2A is a schematic plan view of the first embodiment, showing thermoelectric conversion pixels.
Figure 2B:
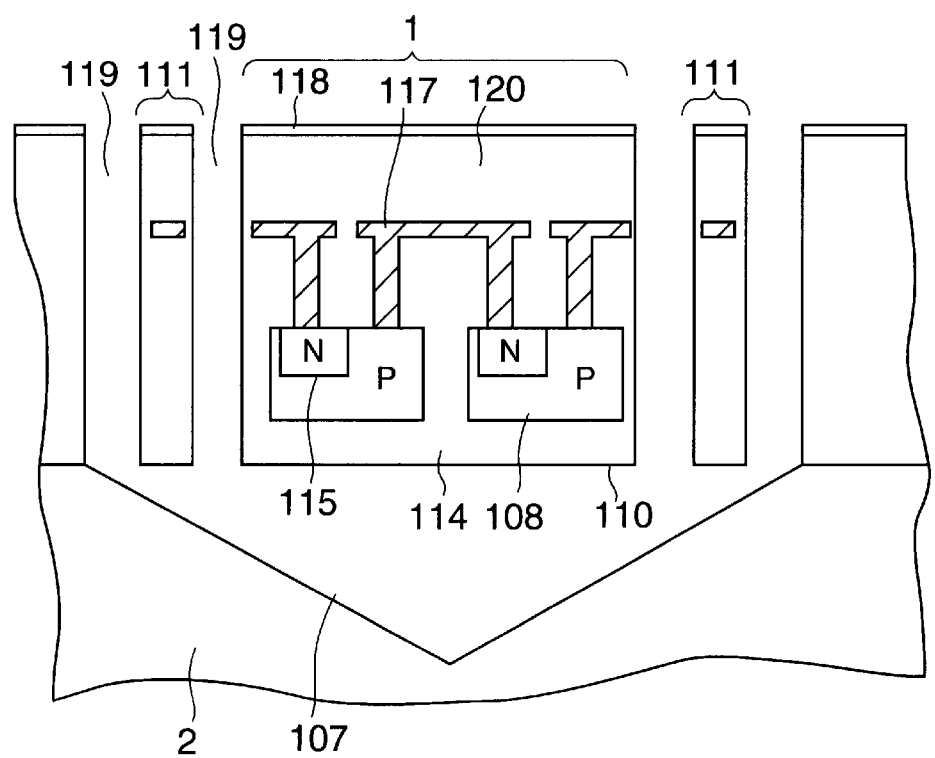
FIG. 2B is a cross sectional view of the first embodiment taken along line A—A in FIG. 2A.

FIGS. 2A and 2B schematically illustrate the structure of the infrared sensing thermoelectric conversion pixel 1 of this embodiment shown in FIG. 1. FIG. 2A is a schematic plan view of the first embodiment, showing thermoelectric conversion pixels and FIG. 2B is a cross sectional view of the first embodiment taken along line A—A in FIG. 2A. The thermoelectric conversion pixel 1 contains pn junction regions 115 for thermoelectric conversion. More specifically, the thermoelectric conversion pixel 1 comprises infrared absorbing sections 118, 120, pn junction regions 115 located in the inside of SOI layers 108 and formed for thermoelectric conversion, a wire 117 connecting them and a thermoelectric conversion section 110 arranged in buried silicon oxide film layer 114 supporting the SOI layers 108, all of which are arranged on a cavity structure 107 formed in the inside of a single crystal silicon semiconductor substrate 2. For the convenience of explanation, FIGS. 2A and 2B show a diode structure of arranging two pn junction regions. The thermoelectric conversion pixel 1 further comprises a support section 111 supporting the pixel 1 by way of the cavity bottom section 107, or a cavity structure, and cavity lateral sections 119 and adapted to output an electric signal from the pixel 1 and a connection section (not shown) connecting the column signal line 5, or the vertical signal line, and the row selection line 4. The heat emission of the pixel proceeds slowly so that the temperature modulation of the element 1 by the incident infrared rays is conducted efficiently due to the fact that the pixel 1 and the support section 111 are arranged on a cavity structure 107.

Figure 3:
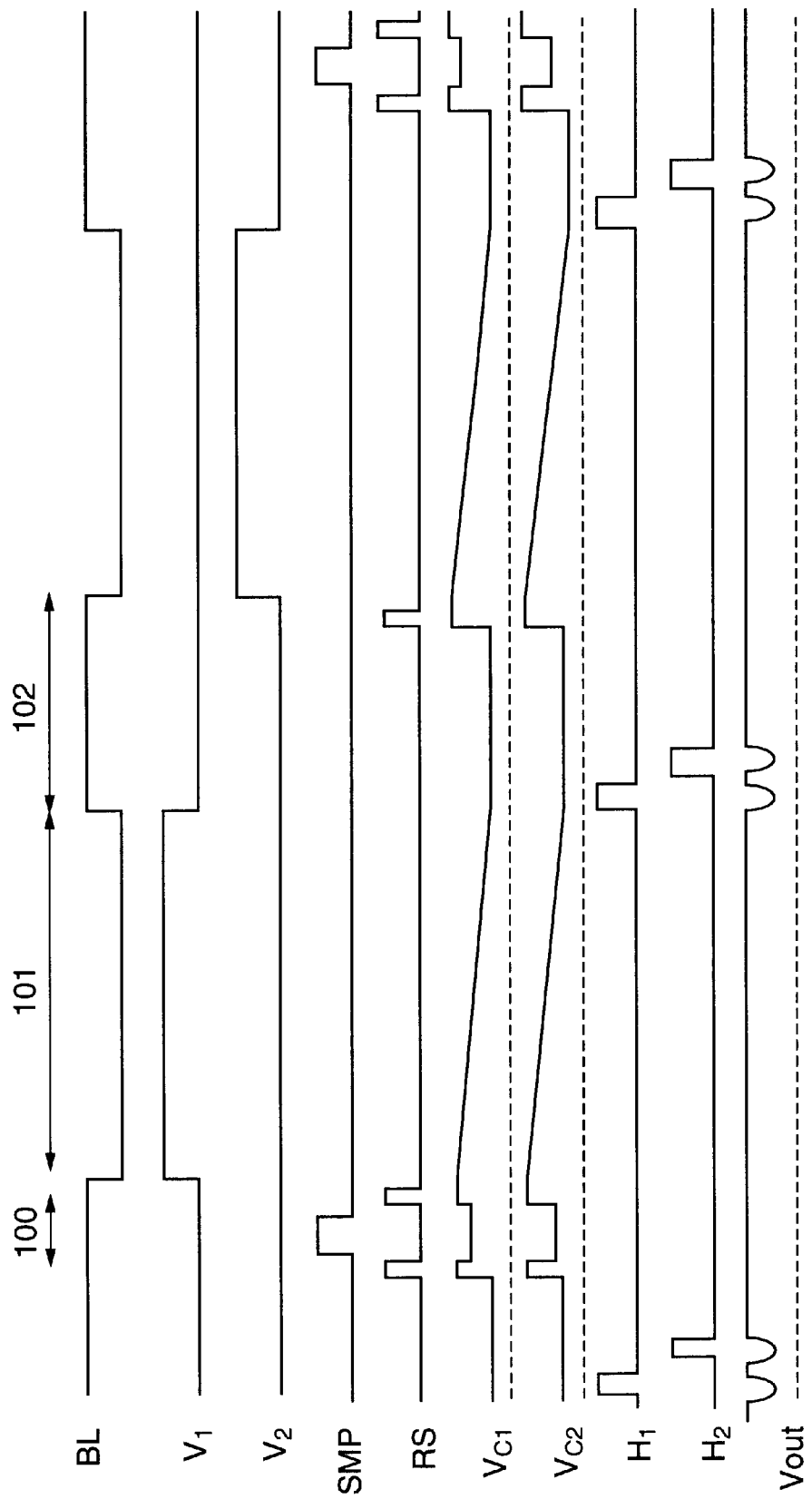
FIG. 3 is a timing chart illustrating the method of driving the first embodiment of infrared sensor.

FIG. 3 is a timing chart illustrating the method of driving the first embodiment of infrared sensor, which is applicable when the embodiment comprises four pixels arranged in the form of a matrix of two rows and two columns as shown in FIG. 1. The source potential of the load MOS transistor 8 and the source potential of the amplifier transistor 10 that are not shown in the timing chart are equal to the substrate voltage Vs, while the drain voltage of the reset transistor 13 that is not shown in the timing chart either is made equal to the supply voltage Vd.

Referring to FIG. 3, a non-selection period 100 during which the row selection circuit 40 does not select any row precedes period 101 during which the first row selection line 4-1 is selected as shown on the first line of FIG. 3. An operation of obtaining and storing the threshold information of the amplifier transistor 10 is performed in this non-selection period 100. The voltage of the vertical signal lines 5 is made equal to the source voltage of the load MOS transistor 8 and hence to the substrate potential in this non-selection period 100.

Firstly, the reset transistor 13 is turned on to reset the voltages Vc1, Vc2 of the storage capacitor 12. Then, the sampling transistor (SMP) 15 is turned on and the drain voltage of the amplifier transistor 10 that is reset to the supply voltage Vd is applied to the gate 10g of the amplifier transistor 10 during the non-selection period 100. Thus, the amplifier transistor 10 is turned on and a drain current flows. The drain voltage Vc falls as a result of the drain current to consequently reduce the conductance of the amplifier transistor 10 so that the drain voltage Vc is made equal to the gate voltage and hence the drain current no longer flows. This voltage is the threshold voltage of the amplifier transistor 10 of each row.

The threshold information is held in the coupling capacitor 11 as the sampling transistor 15 is turned off after the threshold information of the amplifier transistor 10 is read to the gate voltage as sampled value. The threshold information is read once within a frame period before the selection of the first row but not before the selection of the second row and the following rows. Thus, the threshold information held before the selection of the first row is used thereafter.

During the row selection period 101 shown on the first line in FIG. 3, a row selection pulse V1 is applied to the first row selection line 4-1 and the bias current whose value is determined by the load transistor 8 flows the current path formed by the load transistor 8, the vertical signal line 5, the first row pixel 1, the first row selection line 4-1 and the row selection circuit 40. The operation point of the pixel 1 is determined by the bias current and the temperature of the pn junctions that are the thermoelectric conversion means of the pixel 1 and a pixel output voltage that changes as a function of the temperature of the pixel 1 is generated in the vertical signal line 5 of each column. Then, the voltage of the vertical signal line 5 changes from the substrate voltage to the pixel output voltage.

The voltage change of the vertical signal line 5 by turn changes the gate voltage of the amplifier transistor 10 due to the coupling caused by the coupling capacitor 11. Thus, the gate voltage of the amplifier transistor 10 becomes to be equal to the threshold information of the amplifier transistor 10 held in the non-selection period 100 plus the pixel output voltage information. As a result, the amplifier transistor 10 is turned on and the drain current that corresponds to the vertical signal line voltage flows. The electric current is integrated in the storage capacitor 12 during the first row selection period 101 to change the drain voltage Vc. At this time, the gate voltage that governs the drain current of the amplifier transistor 10 is not affected by the threshold value that can vary from column to column because it is determined by the extent of the shift from the held threshold voltage.

During the horizontal read period 102 that follows the selection period 101, the horizontal read transistors 61, 62 are sequentially selected by the horizontal selection circuit 70 and the drain voltages Vc1, Vc2 are read to the output line 24 on a time series basis. The operation of the second row and that of any of the following rows are similar to that of the first row except the sampling transistor 15 does not operate. Thus, the drain currents during the respective row selection periods are integrated and sequentially read out.

As described above, with this embodiment, the threshold information of the amplifier transistor 10 that varies from column to column is held to the coupling capacitor 11 that is connected to the gate of the amplifier transistor 10 because of the threshold read operation during the non-selection period 100. Therefore, the operation of integrating the electric current during the row selection period 101 is not affected by the variance of the threshold value of the amplifier transistor 10 and hence the drain current is determined only by the pixel output voltage produced on the vertical signal line 5.

Thus, for the operation of the amplifying/read circuit 9 that is triggered by the integration of the drain current, it is no longer necessary to provide a margin for the purpose of preventing saturation of the storage capacitor 12 that can be caused by the fluctuations of threshold value of about 30 mV that is by far higher than the pixel signal voltage produced on the vertical signal line 5 with a magnitude of 1V. As a result, it is now possible to obtain a high voltage gain to significantly reduce the influence of noise to the amplifying/read circuit 9 and the downstream circuits. Thus, according to the invention, there is provided an uncooled type infrared sensor with a low noise, high sensitivity and wide dynamic range.

The operation of the amplifying/read circuit 9 of this embodiment can be optimized in terms of gain and saturation by means of the source voltage of the load MOS transistor 8, the selection pulse voltage of the row selection circuit 40, the source voltage of the amplifier transistor 10 and the drain voltage of the reset transistor 13.

(2nd Embodiment)

Figure 4:
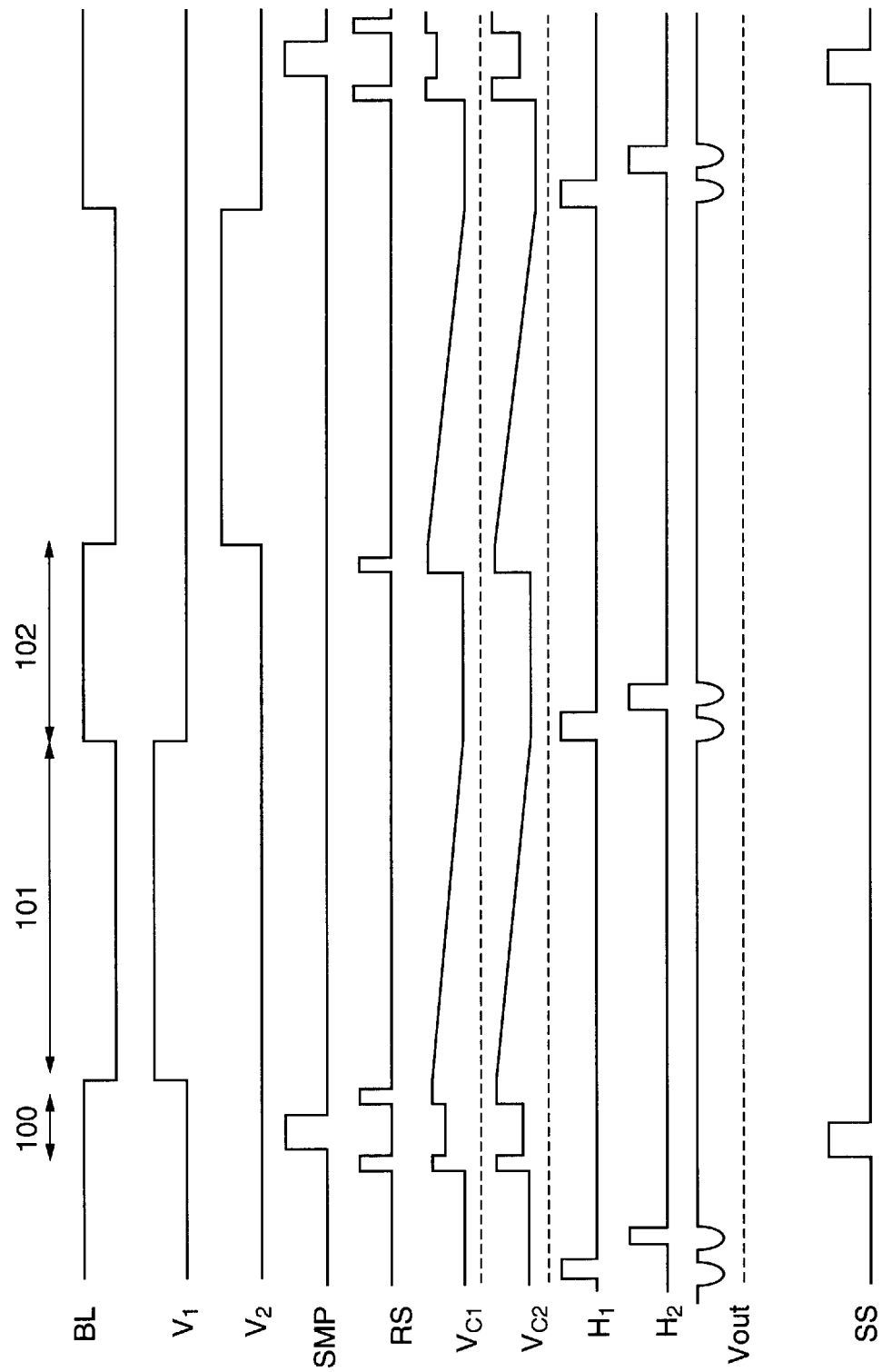
FIG. 4 is a timing chart illustrating the method of driving the second embodiment of infrared sensor.

FIG. 4 is a timing chart illustrating the method of driving the second embodiment of infrared sensor.

This embodiment of infrared sensor has a configuration same as the first embodiment illustrated in FIGS. 1 and 2. It will be appreciated that the timing chart of FIG. 4 of this embodiment is substantially same as the timing chart of FIG. 3 of the first embodiment. However, the timing chart (FIG. 4) of this embodiment differs from that of the first embodiment in that the source voltage SS of the amplifier transistor 10 is driven by a pulse. In other words, a pulse voltage is applied to the source SS of the amplifier transistor 10 for the threshold information acquiring operation of the amplifier transistor 10 during the non-selection period 100.

With this drive arrangement, the operation point of the flow path of the bias current including the pixel 1 in the row selection period is not changed to make it possible to regulate the voltage between the gate and the source of the amplifier transistor 10 during the amplifying/read operation so that the operation point of the amplifying/read circuit 9 can be regulated with ease to make it operate in an optimal condition. Thus, according to the invention, there is provided an uncooled type infrared sensor with a low noise, high sensitivity and wide dynamic range.

(3rd Embodiment)

Figure 5:
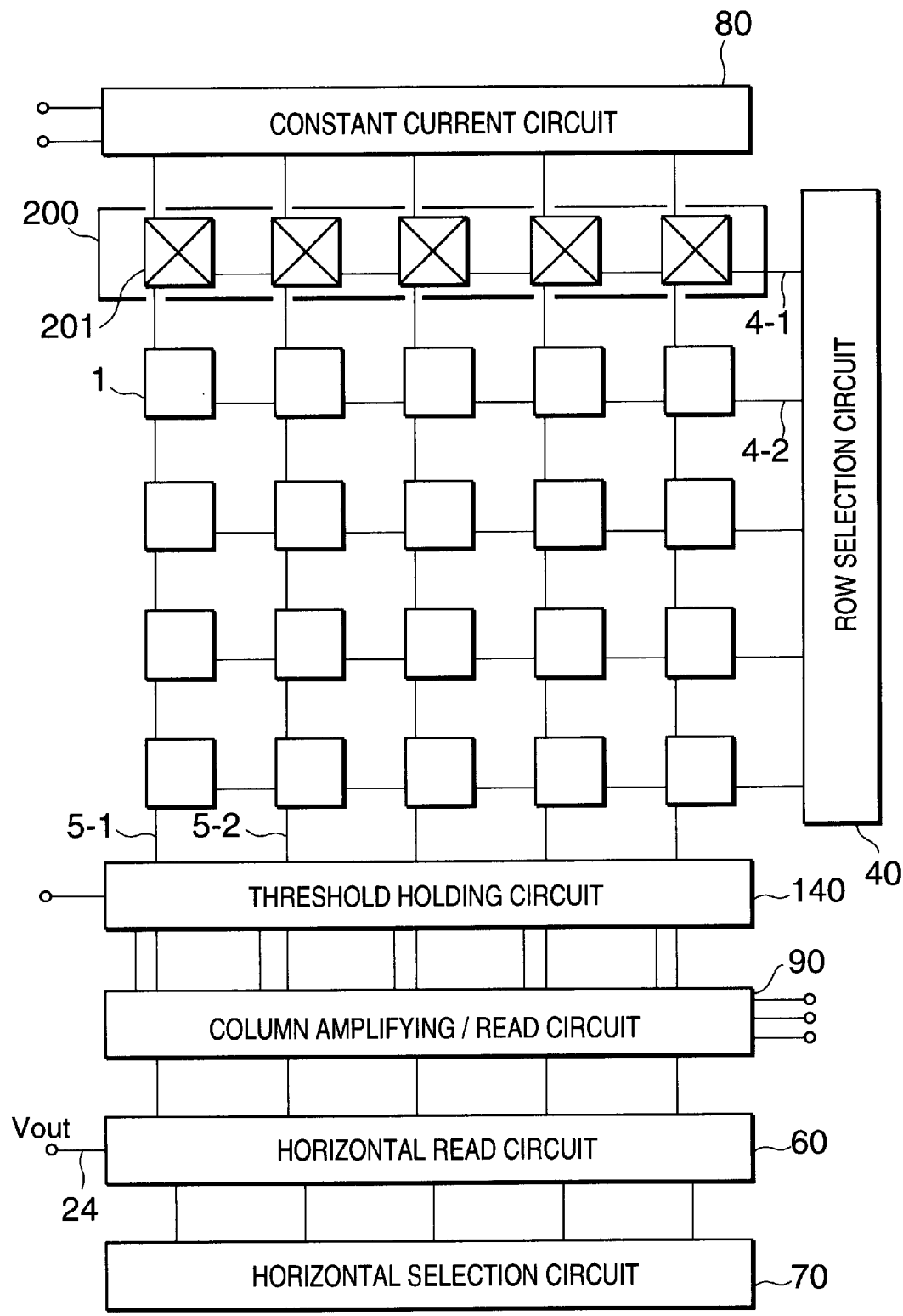
FIG. 5 is a schematic circuit diagram of the third embodiment of infrared sensor according to the invention, illustrating its entire configuration.

FIG. 5 is a schematic circuit diagram of the third embodiment of infrared sensor according to the invention, illustrating its entire configuration. In FIG. 5, the circuit configuration of the sensor is illustrated in a simplified form if compared with FIG. 1. It will be appreciated that 25 pixels are arranged in the form of a matrix of 5 rows and 5 columns. In FIG. 5, the components same as or similar to those of the FIG. 1 are denoted respectively by the same reference symbols and will not be described any further.

A row selection pulse is applied to the row selection line 4 selected by the row selection circuit 40 and the bias current supplied from a constant current circuit 80 comprising load MOS transistors is made to flow to the pixel 1 of the selected row by way of the corresponding vertical signal line 5 to produce a pixel output voltage, which corresponds to the operation points of the pn junctions of the pixel that are determined as a function of the bias current and the temperature of the pixel 1, on the vertical signal line 5. The vertical signal line 5 is connected to column amplifying/read circuit 90 by way of a threshold holding circuit 140 comprising coupling capacitors 11 and sampling transistors 15. The grouped pieces of signal voltage information Vout for a row amplified in the column amplifying/read circuit 90 are sequentially read out from horizontal read circuit 60 to output terminal 24 by the horizontal selection circuit 70.

An insensitive pixel row 200 formed by insensitive pixels 201 showing no sensitivity to infrared rays is arranged in the imaging region of this embodiment and the row selection circuit 40 can select an insensitive pixel 201 by means of a row selection means as in the case of selecting an ordinary pixel 1.

Figure 6A:
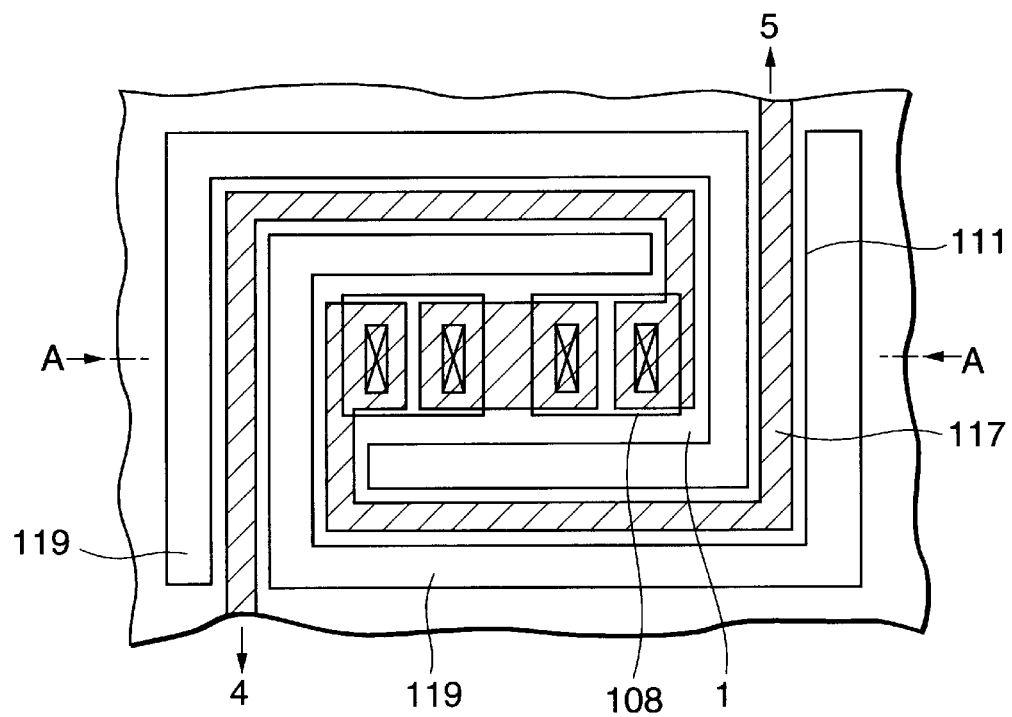
FIG. 6A is a schematic plan view of the third embodiment, showing thermoelectric conversion pixels.
Figure 6B:
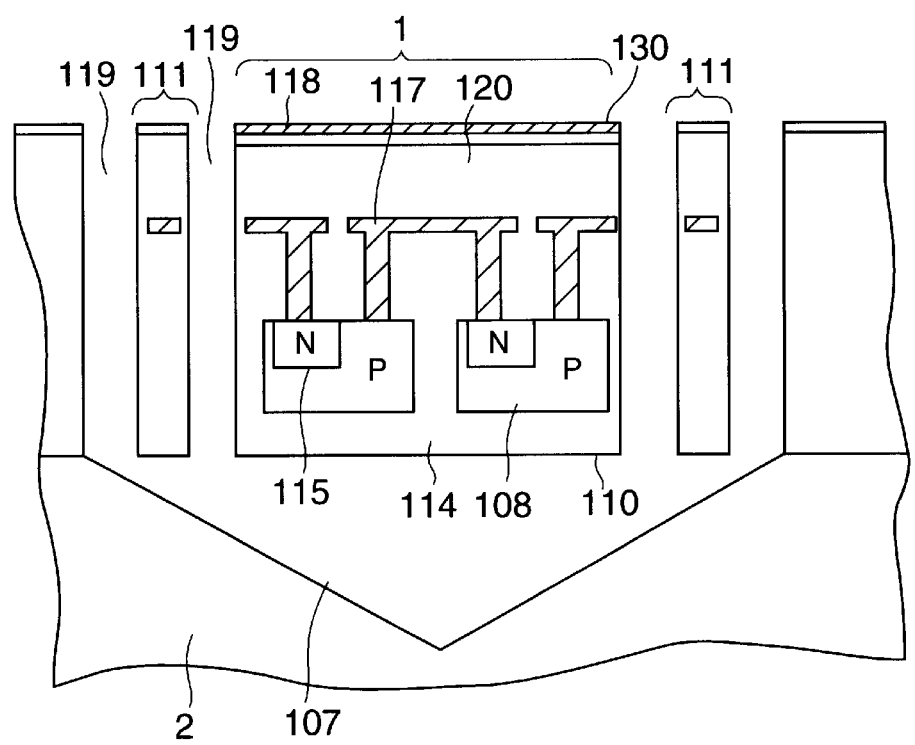
FIG. 6B is a cross sectional view of the third embodiment taken along line A—A in FIG. 6A.

As shown in FIGS. 6A and 6B, each thermally isolated insensitive pixel 201 has a structure substantially same as that of an ordinary pixel shown in FIG. 2 except only that the former is provided on the infrared absorbing section 118 with an infrared reflecting layer 130 made of metal film such as aluminum film.

Thus, incident infrared rays are reflected by the infrared reflecting layer 130 of the thermally isolated insensitive pixel 201 so that no temperature change occurs in the pixel if infrared rays come in and the pixel outputs only a self heating signal to the vertical signal line 5 when it is selected. Since no temperature change occurs if infrared rays come in, the pixel operates as insensitive pixel that is not sensitive at all to infrared rays.

As the sensor comprising an insensitive pixel row 200 in the imaging region as shown in FIG. 5 is driven by means of the timing chart of FIG. 3, the insensitive pixel row 200 provides output information. The noise level of the sensor can be reduced further by acquiring the output of the insensitive pixel row 200. More specifically, reset noise occurs in the coupling capacitor 11 when the threshold information of the amplifier transistor 10 is held to the coupling capacitor 11. The reset noise is same throughout the columns in a frame period because the threshold information is held for a frame period. Therefore, it is possible to eliminate the noise by reading the signal of the insensitive pixel row 200 and processing the signal by means of an external circuit to see the difference between the output of the insensitive pixel row 200 and that of the ordinary pixel row. Thus, according to the invention, it is possible to provide an uncooled type infrared sensor with a low noise, high sensitivity by using an insensitive pixel row 200.

If the coupling capacitance is Cc, the Boltzmann constant is k and the absolute temperature of the device is T, the reset noise is expressed by $(kT/Cc)^{1/2}$. If Cc=1pF, the reset noise will be as large as 60 iv. This value is less than $\frac{1}{100}$ of the variance (about 30 mV) of the threshold value of the amplifier transistor 10 and hence it is not necessary to provide a margin for the operation of the amplifying/read circuit 9. Additionally, while a vertical strip-like fixed pattern noise may be generated in a frame, such a noise can be eliminated by determining the difference between the output of an ordinary pixel and an insensitive pixel, utilizing the correlation thereof in the frame. Therefore, the reset noise does not constitute any increase to the overall noise.

Figure 7:
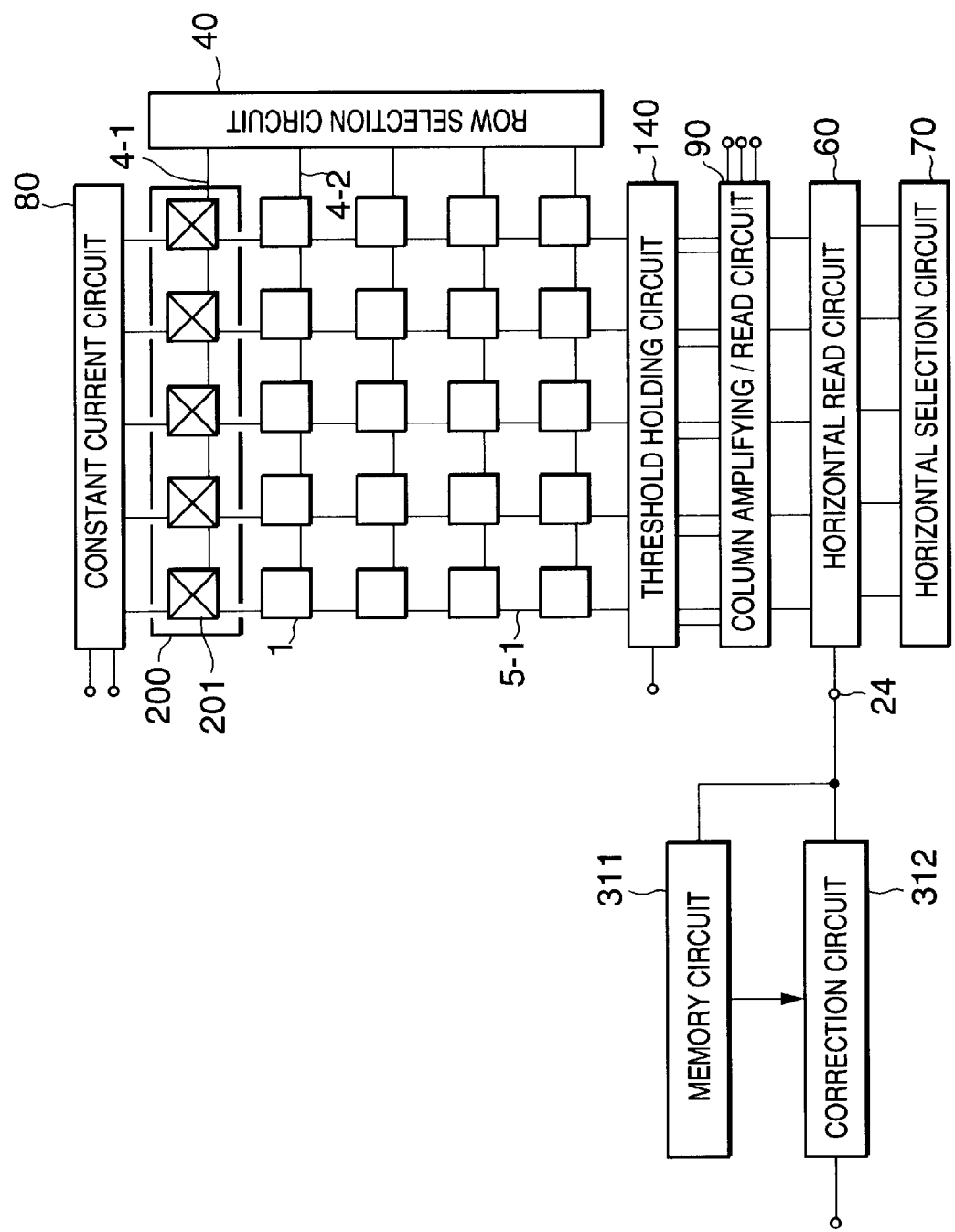
FIG. 7 is a schematic circuit diagram of am embodiment obtained by modifying the third embodiment.

Additionally, as shown in FIG. 7, it is also possible to provide within the chip a memory circuit 311 for holding the pieces of output information of a row and a correction circuit 312 for correcting the output from a row different from the row for which the pieces of output information are held by means of those pieces of output information.

(4th Embodiment)

Figure 8:
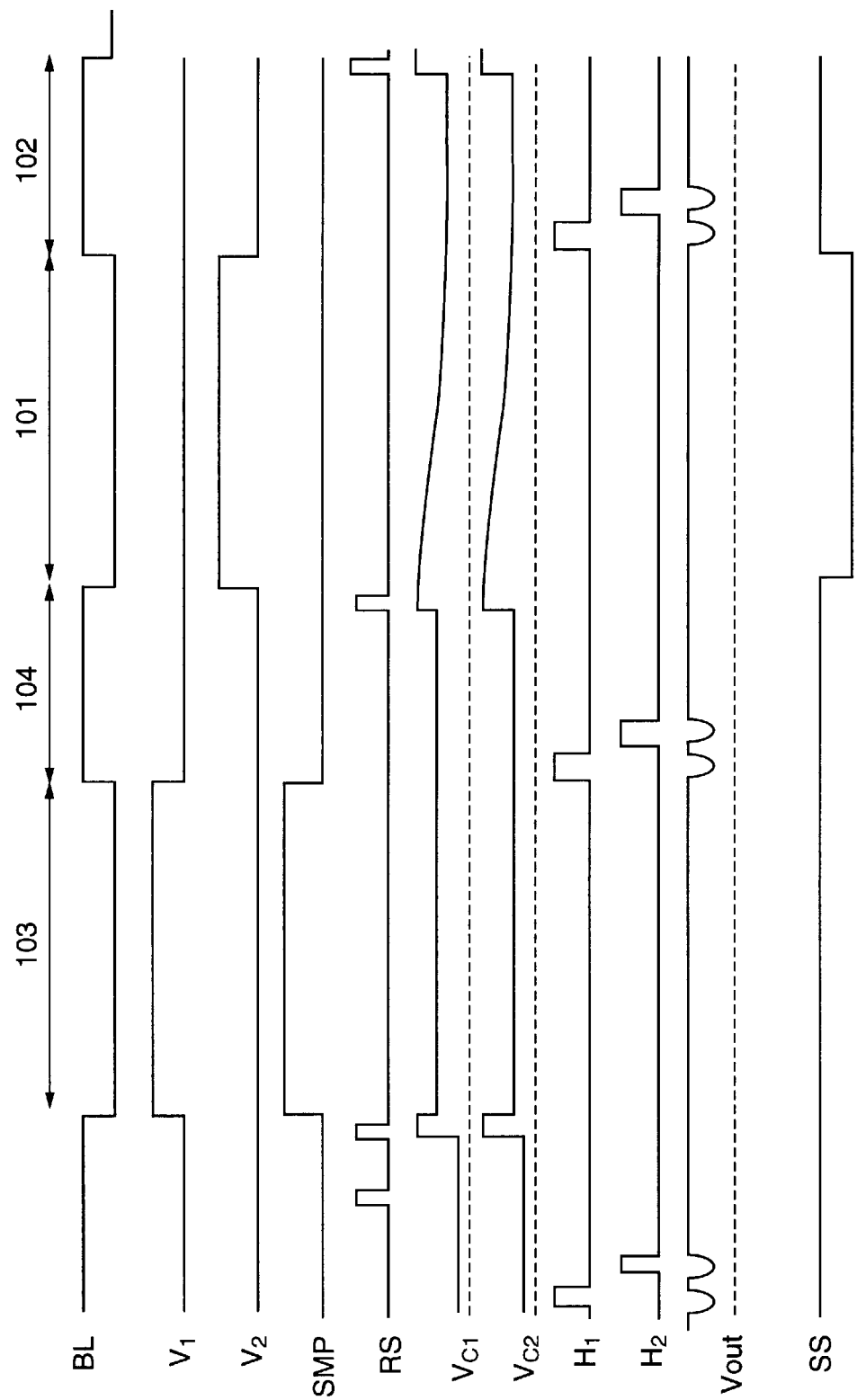
FIG. 8 is a timing chart illustrating the method of driving the fourth embodiment of infrared sensor.

FIG. 8 is a timing chart illustrating the method of driving the fourth embodiment of infrared sensor. It is adapted to drive an infrared sensor comprising pixels arranged in the form of a matrix of two rows and two columns. FIG. 8, the timing chart of the top line is used to drive an insensitive pixel row.

This embodiment of infrared sensor has a configuration same as that of the third embodiment illustrated in FIG. 5. While a matrix of two rows and two columns is used in FIG. 8 for the purpose of simplicity, it will be appreciated that an infrared sensor comprising pixels arranged in five rows and five columns can be driven in a similar way.

In this embodiment, the threshold information of the amplifier transistor 10 is read not in a non-selection period but in a selection period 103 of the insensitive pixel row. Since the threshold information is read in a period 103 for selecting the insensitive pixel row 200, a pulse voltage is applied to the source SS of the amplifier transistor during the selection period 103. The threshold information read during the selection period 103 of the insensitive pixel row is then read to the output line 24 as a result of that the horizontal read transistors 14 are sequentially selected by the horizontal selection circuit 6 in the immediately following horizontal read period 104.

Thus, in this embodiment, the offset voltage added to the threshold information that is read to the coupling capacitor 11 can be regulated by means of the pulse voltage applied to the source of the amplifier transistor. Therefore, it is possible to regulate the operation point of the amplifying/read circuit 9. As a result of carrying out the operation of reading the threshold information during the selection period 103 of the insensitive pixel row 200, not only the threshold information of the amplifier transistor 10 but also the threshold information of the load MOS transistor 8 that operates as constant current source are read. Then, even a greater gain may be selected for the amplifying/read circuit 9 so that it is possible to provide a low noise, high sensitivity and wide dynamic range uncooled type infrared sensor.

(5th Embodiment)

Figure 9:
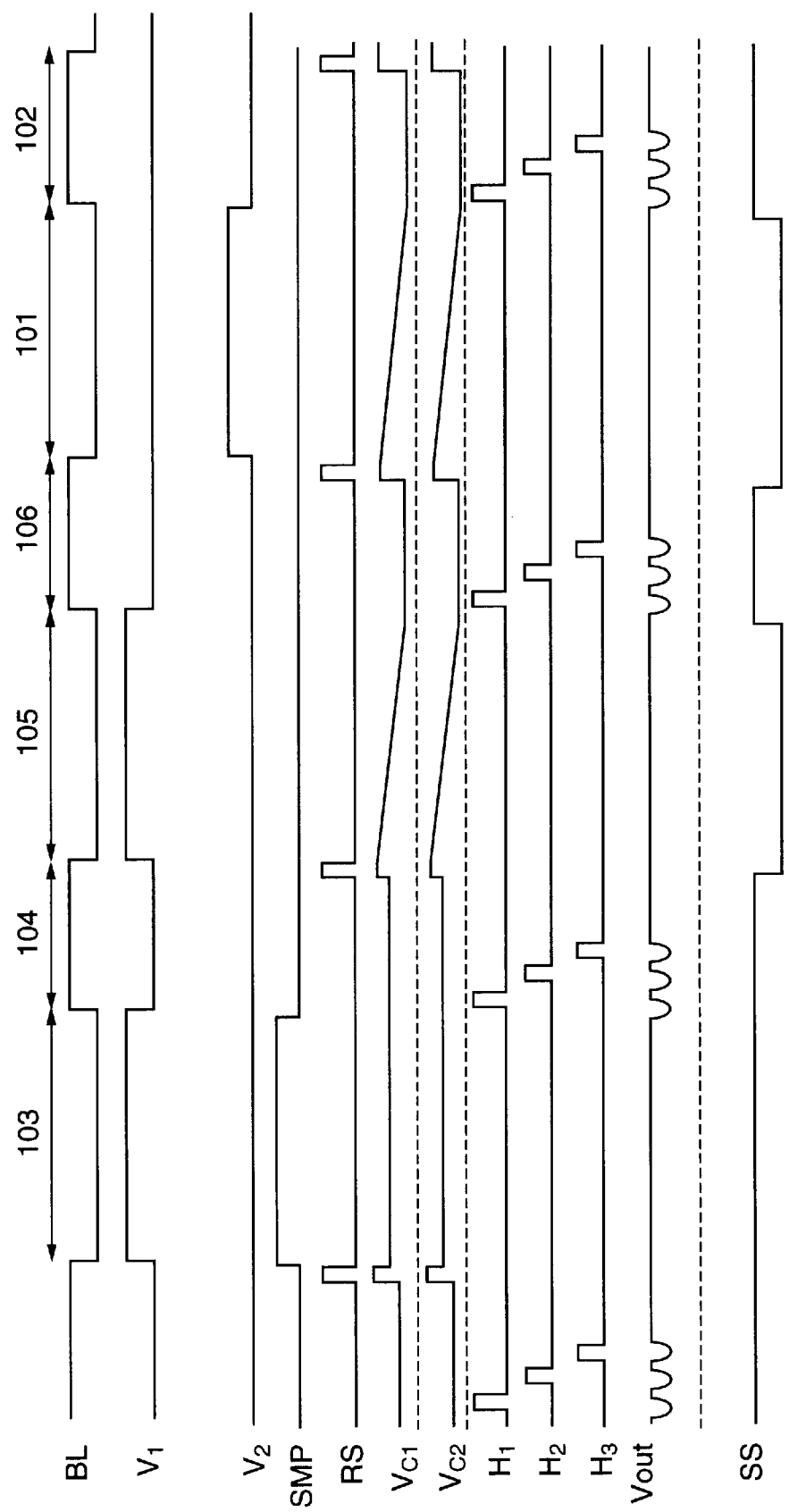
FIG. 9 is a timing chart illustrating the method of driving the fifth embodiment of infrared sensor.

FIG. 9 is a timing chart illustrating the method of driving the fifth embodiment of infrared sensor. The timing chart is adapted to drive a pixel arrangement of two rows and three column, of which the first row is an insensitive pixel row.

In this embodiment, the row selection circuit 40 selects twice the insensitive pixel row 200. The threshold information is read in the first row selection period 103 and the insensitive pixel output is obtained in the second row selection period 105. The threshold information obtained in the first row period 103 is hold in the coupling capacitor 11 by SMP pulse operation. The insensitive pixel read in the selection period 105 is read out in the immediately following horizontal read period 106.

Thus, with the timings of FIG. 9, both the operation of reading the threshold value by an insensitive pixel and that of reading the insensitive pixel output can be performed with the structure having a single row of insensitive pixels. Then, the influence of variance of the threshold value of the amplifier transistor 10 can be eliminated by reading the threshold value and the reset noise of the coupling capacitor 11 can be eliminated by reading the insensitive pixel output and determining the difference between the insensitive pixel output and the output of an ordinary pixel by means of an external circuit as described above.

(6th Embodiment)

Figure 10:
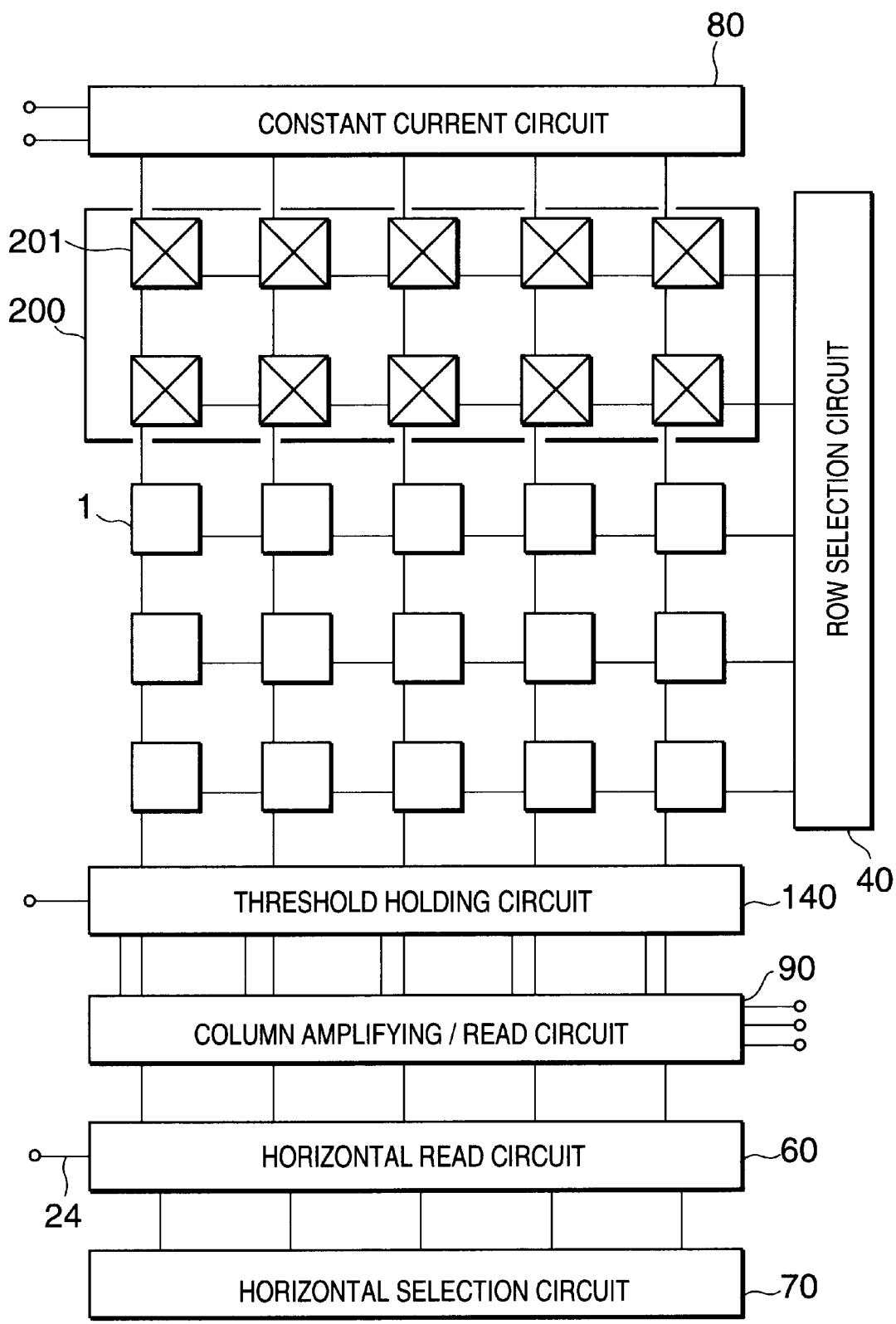
FIG. 10 is a schematic circuit diagram of the sixth embodiment of infrared sensor according to the invention, illustrating its entire configuration.

FIG. 10 is a schematic circuit diagram of the sixth embodiment of infrared sensor according to the invention, illustrating its entire configuration. In FIG. 10, the circuit configuration of the sensor is illustrated in a simplified form if compared with FIG. 1. It will be appreciated that 25 pixels are arranged in the form of a matrix of 5 rows and 5 columns. Two rows of insensitive pixels 2 are arranged in this embodiment.

Figure 11:
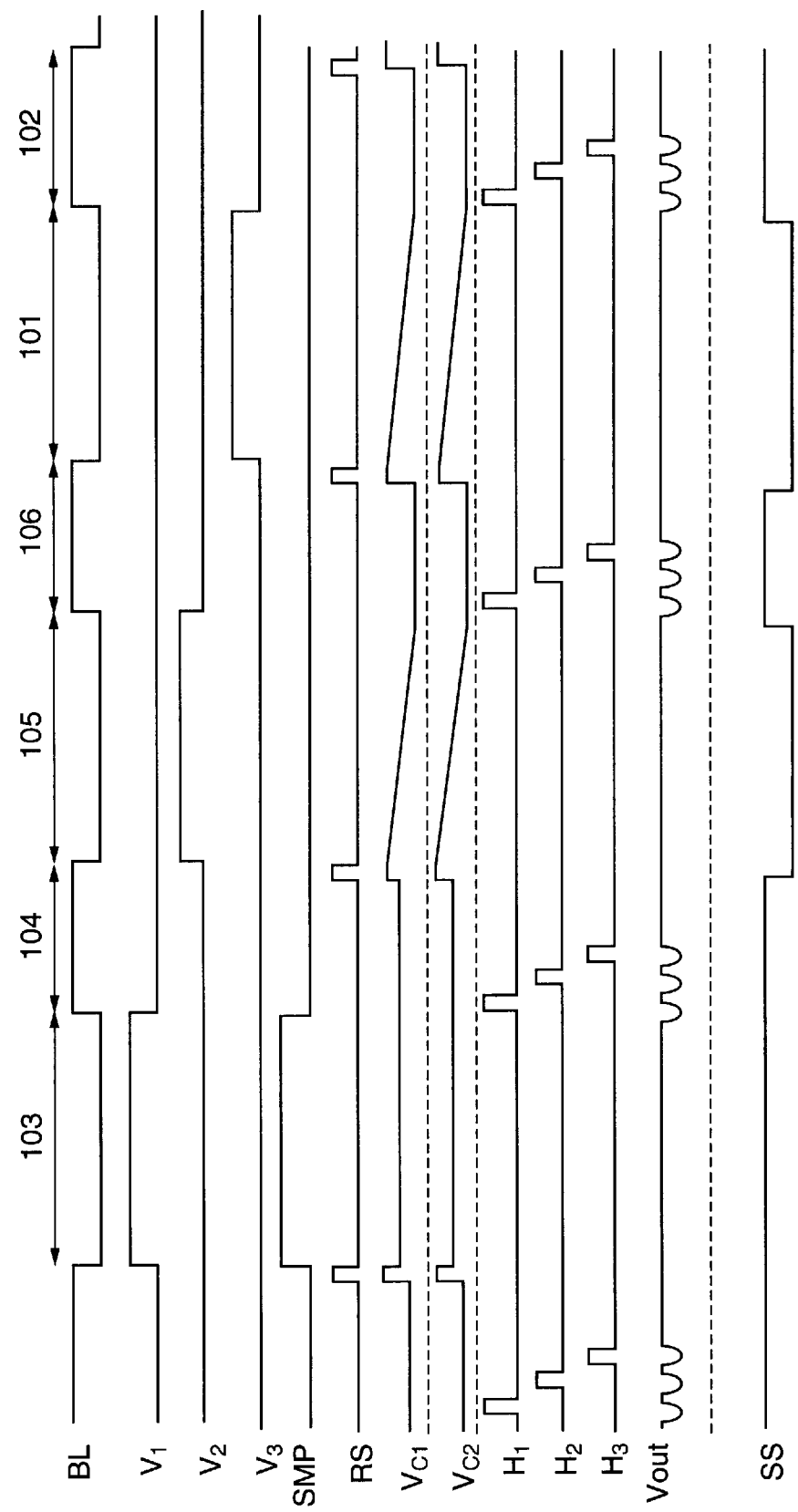
FIG. 11 is timing chart illustrating the method of driving the sixth embodiment of infrared sensor.

FIG. 11 is timing chart illustrating the method of driving the sixth embodiment of infrared sensor. The threshold information is read in period 103 shown on the top line for selecting an insensitive pixel row and the insensitive pixel output is obtained in period 105 shown on the second line also for selecting an insensitive pixel row. A high voltage is applied to the source of the amplifier transistor 10 during the threshold information read period and a low voltage is applied to the source during the periods 105, 101 for amplifying and reading the pixel output signal.

With this embodiment, it is possible to read the threshold value by means of the selected insensitive pixel and also read the insensitive pixel output to eliminate the variance of the threshold value of the amplifier transistor 10 and the reset noise of the coupling capacitor 11. Additionally, it is possible to use a simple shift register circuit for the row selection circuit 40 to simplify the design of the peripheral circuits.

(7th Embodiment)

With the arrangement of FIG. 7, a storage/retaining means 311 for holding the output signal obtained on the basis of the retained insensitive row information for a frame period and a correction means 312 for correcting the effective output signal on the basis of the retained/stored information need to be provided. Furthermore, the embodiment is apt to be influenced by the leak current of the coupling capacitor 11 and that of the transistor connected to the coupling capacitor 11 because the coupling capacitor 11 is adapted to store the threshold information for a frame period. Then, if the leak currents are large, the retained threshold information can be changed within a frame period to give rise to a longitudinal shading phenomenon on the output image. The seventh embodiment and the following embodiments are provided with means for avoiding this problem.

Figure 12:
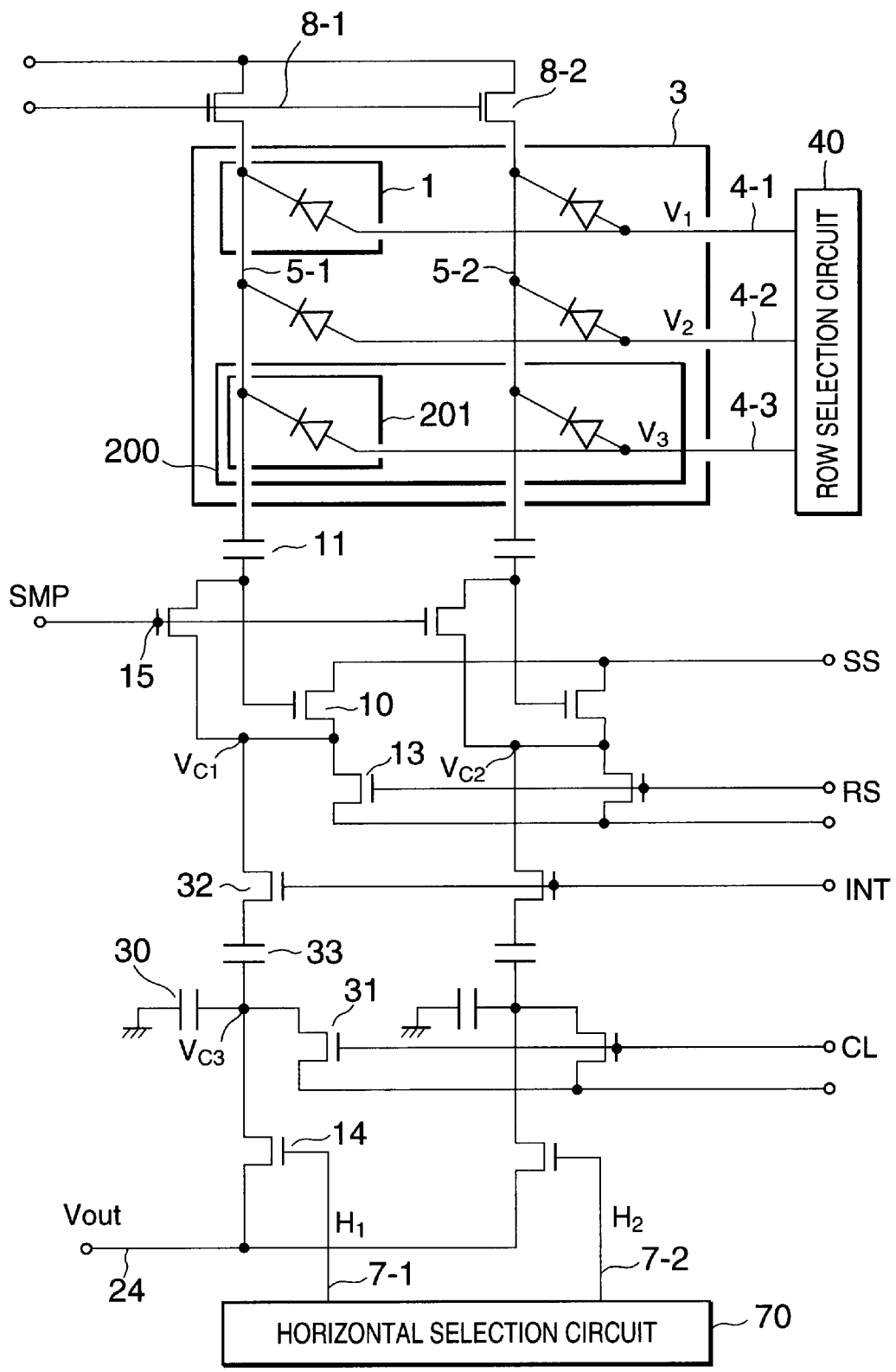
FIG. 12 is a schematic circuit diagram of the seventh embodiment of infrared sensor according to the invention, illustrating its entire configuration.

FIG. 12 is a schematic circuit diagram of the seventh embodiment of infrared sensor according to the invention, illustrating its entire configuration. As shown, the embodiment comprises pixels arranged in three rows and two columns. In FIG. 12, the components same as or similar to those of the embodiment of FIG. 1 are denoted respectively by the same reference symbols and will not be described any further. While pixels are arranged in three rows and two columns in FIG. 12 for the purpose of simplification, it may be needless to say that the embodiment can comprise more pixels arranged in the form of a matrix of m rows and n columns.

In FIG. 12, thermoelectric conversion pixels 1 are arranged in the upper two rows and insensitive pixels 201 are arranged in the bottom row to form an insensitive pixel row 200. The imaging region 3 includes a region where the thermoelectric conversion pixels 1 for converting incident infrared rays into an electric signal are two-dimensionally arranged and a region of the insensitive pixel row 200 of insensitive pixels 201.

The configuration of the thermoelectric conversion pixels 1 is same as that of FIG. 2. The configuration of the insensitive pixels 201 is similar to FIG. 2, but without having the cavity structure. While the insensitive pixel row 200 is arranged below the thermoelectric conversion pixel rows in FIG. 12, it may alternatively be arranged above the thermoelectric conversion pixel rows, if necessary. While at least a single insensitive pixel row has to be provided, two or more than two insensitive pixel rows may alternatively be provided, if appropriate.

Row selection lines 4 (4-1, 4-2, 4-3) and vertical signal lines 5 (5-1, 5-2) are arranged in the imaging region 3. The row selection lines 4 are connected to the row selection circuit 40 for selecting a row and driven to select for that purpose. The vertical signal lines 5 are connected to a constant current source for supplying a bias current to be used for reading a signal from a thermoelectric conversion pixel 1 or an insensitive pixel 201.

A first coupling capacitor 11 is arranged between each of the vertical signal lines 5 and the gate of the corresponding one of the amplifier transistors 10 (10-1, 10-2) and a sampling transistor 15 is arranged between the gate and the drain of each of the amplifier transistors 10 in order to bypass the problem attributable to the variance of the threshold voltage of the amplifier transistors 10 as in the case of FIG. 1. However, the circuit configuration of FIG. 12 differs from that of FIG. 1 in terms of the amplifying/read circuit and the downstream circuits. The drain of each of the amplifier transistors 10 is connected to a second coupling capacitor 33 by way of an integrating transistor (INT) 32 arranged on each column. The other end of each of the second coupling capacitors 33 is connected to a storage capacitor 30 and also to a clamp transistor (CL) 31. The signal voltages stored and retained in the storage capacitors 30 are sequentially reads by the horizontal selection circuit 6 to the output section 24 by way of the horizontal read transistors 61, 62 on a time series basis.

With the arrangement of FIG. 12, the threshold voltage information of the amplifier transistors 10 is sampled in each horizontal scanning period so that the duration of holding the threshold voltage information of the coupling capacitors can be reduced to that of the horizontal scanning period. Thus, the influence of the leak currents of coupling capacitors 11 and the sampling transistors 15 connected thereto can be remarkably reduced.

For example, the threshold voltage holding period of the coupling capacitor 11 is equal to a frame period with the arrangement of FIG. 1. Therefore, there is a risk of producing a vertical shading phenomenon due to the influence of such leak currents. Additionally, more serious vertical shading problems can arise and the image operation can become impossible from a certain row if the level of such leak currents is raised due to variances in the manufacturing process. In other words, a long threshold voltage holding period can give rise to problems in from the viewpoint of both stability of sensor performance and that of manufacturing process.

To the contrary, with this embodiment, since the threshold voltage is sampled in each horizontal scanning period so that the above described vertical shading problem does not arise. Additionally, since the duration of holding the threshold voltage is reduced greatly from a frame period to a horizontal scanning period, the specification for the purpose of prevention of leak current is allowed to be by far less rigorous to by turn improve the stability of manufacturing process and hence infrared sensors according to the invention can be manufactured on a stable and reliable basis.

Furthermore, with the arrangement of FIG. 12, the difference between the output voltage of the selected thermoelectric conversion pixel 1 and that of the selected insensitive pixel 2 can be determined for every horizontal scanning period. This means that the two types of noise as described below can be reduced and hence the manufacturing yield can be improved because of the effect of suppressing such noises. One is the reset noise that appears in the operation of sampling the threshold voltage information of the amplifier transistor 10. With this embodiment, this type of noise can be eliminated inside the column amplifying/read circuit. The reset noise of the coupling capacitor 11 can be estimated in a manner as described below.

The reset noise voltage is expressed by $Vn=(kT/C)^{1/2}$, where k is the Boltzmann constant and T is the absolute temperature. Therefore, if the coupling capacitance is assumed to be equal to 1 pF, the reset noise that is generated in the coupling-capacitor is as large as about 60 iV. If the above described estimated infrared sensitivity is applied, the above value refers to 1.2[K] when reduced to the temperature of the object of imaging. Therefore, the reset noise can be a very large noise component. Thus, in order to realize a high sensitivity sensor, it is indispensably necessary to remove the reset noise of the coupling capacitor by any means. FIG. 7 illustrates an arrangement for removing the reset noise.

Figure 13:
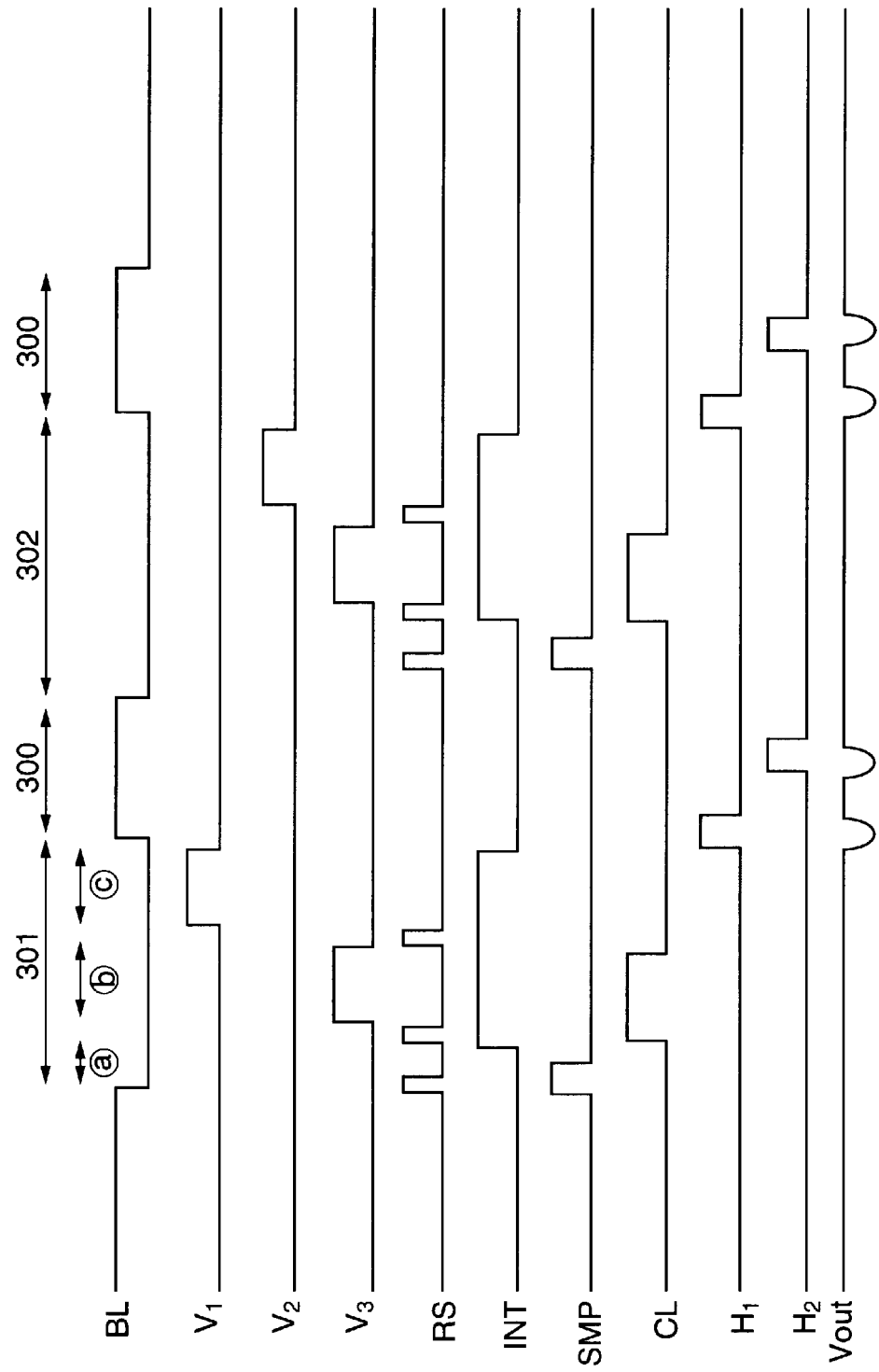
FIG. 13 is a timing chart illustrating the method of driving the seventh embodiment of infrared sensor.

FIG. 13 is a timing chart illustrating the method of driving the seventh embodiment of infrared sensor. Now, the operation of the infrared sensor of FIG. 12 will be described by referring to the timing chart of FIG. 13. An operation of sampling the threshold voltage of an amplifier transistor 10 (period a in FIG. 13), an operation of reading the signal of an insensitive pixel 201 (period b in FIG. 13) and an operation of reading the signal of a thermoelectric conversion pixel 1 (period c in FIG. 3) take place in horizontal blanking period 301.

Firstly, all the row selection lines 4 are held off so that the row selection circuit 40 is held in a non-selection state and hence does not perform any row selecting operation. Therefore, as described above, the substrate potential Vs that is applied as the source voltage of the load MOS transistors 8 appears on the vertical signal lines 5. Then, the sampling transistors 15 and the reset transistors 13 are turned on. As a result, the gate 10g and the drain 10d of each of the amplifier transistors 10 show a same voltage level and reset by the corresponding reset transistor 15. Thus, both of the amplifier transistors 10 are brought into an on state.

Then, as the reset transistors 13 are turned off, the drain voltage and the gate voltage of each of the amplifier transistors 10 fall due to the drain current until the drain current becomes equal to 0. The drain voltage and the gate voltage of each of the amplifier transistors 10 under this condition represent the threshold voltage of the amplifier transistor 10. Thereafter, as the sampling transistors 15 are turned off, the gate and the drain of each of the amplifier transistors 10 are isolated from each other, from then on, each of the sampled threshold voltages is held to the first coupling capacitor 11 of the corresponding column.

Subsequently, the reset transistors 13, the integrating transistors 32 and the clamp transistors 31 are turned on. At this time, the drain voltage of each of the amplifier transistor 10 and the voltage of each of the second coupling capacitors 33 are reset and the voltage Vcs of each of the storage capacitors 30 is fixed to a desired voltage level.

Then, the reset transistors 13 are turned off and the gate modulation integration circuit starts an amplifying/read operation. The supply voltage Vd is applied to the row selection line 4-3 by the row selection circuit 40 to select an insensitive pixel of the insensitive pixel row 200. At this time, the selected insensitive pixel 201 of the insensitive pixel row 200 is forwardly biased by the corresponding load MOS transistor 8 by way of the corresponding vertical signal line 5 so that the operation point of each of the pn junctions in the inside of the insensitive pixel 2 is determined by the forward bias current that is determined by the load MOS transistor 8 and the temperature of the semiconductor substrate 17 and the insensitive pixel output is produced to the vertical signal line 5. The voltage change produced in the vertical signal line 5 modulates the gate voltage of the corresponding amplifier transistor 10 by way of the coupling capacitor 11 to turn on the amplifier transistor 10 so that a drain current flows and stored in the second coupling capacitor 33.

Then, as the selection of the row selection line 4-3 by the row selection circuit 40 is terminated to turn off the amplifier transistor 10 and complete the operation of reading the integrated gate modulation. The signal output of the insensitive pixel 201 is stored in the second coupling capacitor 33. After turning off the clamp transistor 31, the reset transistor 13 is turned on and the drain voltage of the amplifier transistor 10 and the voltage of the second coupling capacitor 33 are reset. The reset transistor 13 is turned off again.

Subsequently, the supply voltage Vd is applied to the row selection line 4-1 by the row selection circuit 40 to select a thermoelectric conversion pixel of the first row. At this time, the selected thermoelectric conversion pixel 1 of the first row is forwardly biased by the corresponding load MOS transistor 8 by way of the corresponding vertical signal line 5 so that the operation point of each of the pn junctions in the inside of the thermoelectric conversion pixel 1 is determined by the forward bias current that is determined by the load MOS transistor 8 and the temperature of the semiconductor substrate 17 and the thermoelectric conversion pixel output of the first row is produced to the vertical signal line 5. An operation of reading the integrated gate modulation by means of the thermoelectric conversion pixel output is conducted in a manner similar to the operation of the row selection circuit 40 for selecting the first row in the period (period c of FIG. 13) or that of the operation for selecting the insensitive pixel row in the above described insensitive pixel row selection period (period b in FIG. 13). As a result, the drain current is stored in the second coupling capacitor 33 as signal charge. Since the clamp transistor 31 is off at this time, the voltage Vcs of the storage capacitor 30 is modulated by the signal charged produced by the above thermoelectric conversion pixel.

Finally, as the integrating transistor 32 is turned off, the operation for the first row in the horizontal blanking period is completed. At this time, the storage capacitor 30 retains the voltage Vcs that is modulated by the difference between the output of the insensitive pixel 201 and the thermoelectric conversion pixel 1 by referring to the clamp voltage that is held to a fixed level by the operation of turning on the clamp transistor 31.

Then, in the horizontal readout period 300, the horizontal read transistors 61, 62 are sequentially turned on by the horizontal selection circuit 70 and their outputs signals are read out to the output line 24 on a time series basis. The operation in the subsequent horizontal blanking period 302 is basically identical with the operation in the above described horizontal blanking period 301 except that the row selection line selected by the row selection circuit 40 is not the first row selection line 4-1 but the second row selection line 4-2. Subsequently, in the horizontal readout period 300 that follows the horizontal blanking period 302, the horizontal read transistors 61, 62 are sequentially turned on by the horizontal selection circuit 70 and their output signals are read out to the output line 24 on a time series basis as in the case of the operation of reading the output signals of the first row.

With the above described operations, it is possible to sample the threshold value of the amplifier transistor 10 in each and every horizontal scanning period as described above so that low noise infrared sensors that are resistant against variances in the manufacturing process can be manufactured at a high yield. Additionally, unlike the arrangement of FIG. 7, no external circuits such as a memory means 311 and a correction means need to be provided so that all the components can be arranged on a chip and hence the infrared sensor can be prepared at low cost.

Figure 14:
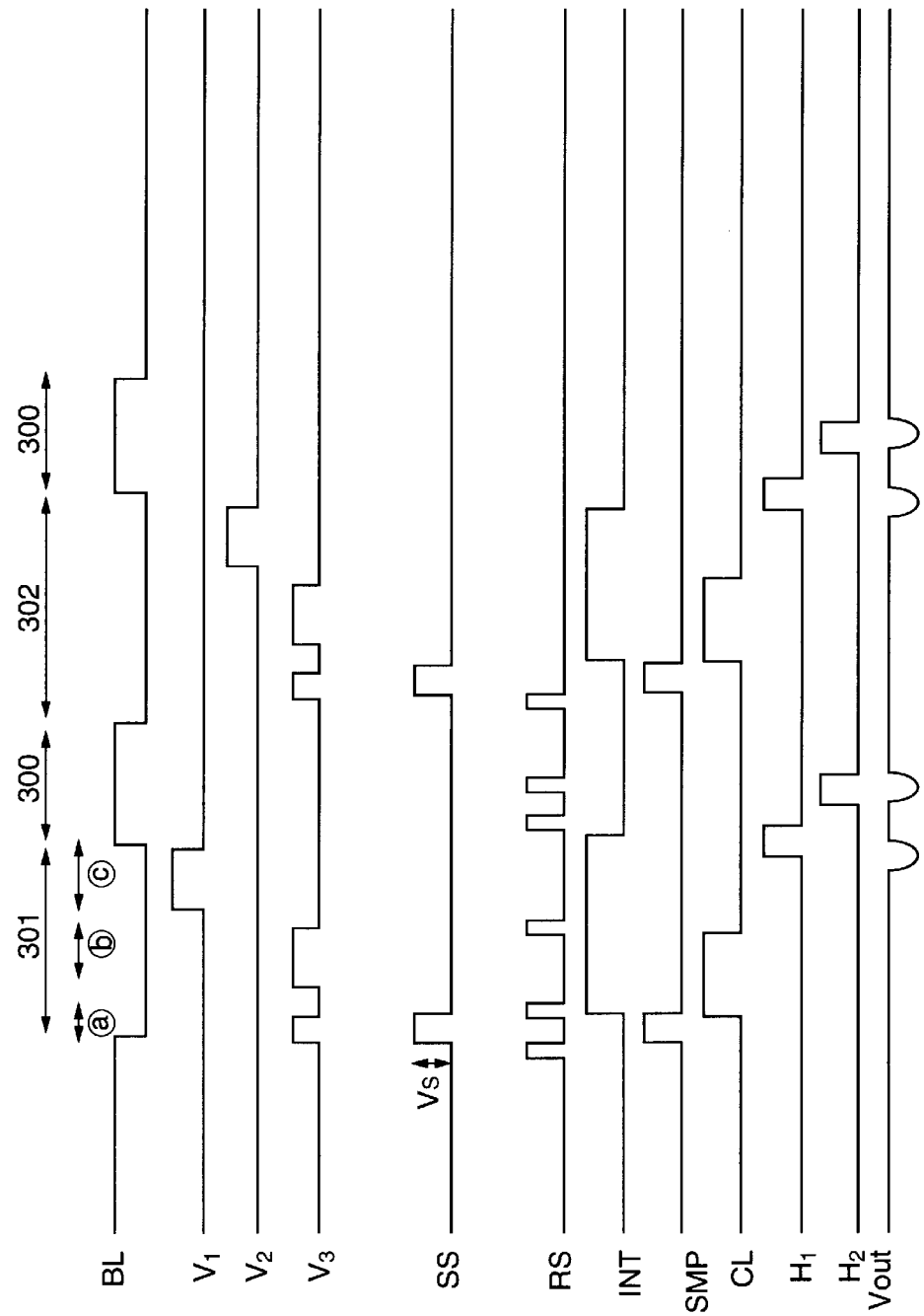
FIG. 14 is also a timing chart illustrating the method of driving the seventh embodiment of infrared sensor.

While there may be a number of different timing charts other than the one shown in FIG. 13 that can be used for driving the embodiment of FIG. 12, the timing chart of FIG. 14 that is adapted to drive the source of the amplifier transistor 10 by means of a pulse voltage will be described below. FIG. 14 is basically identical with FIG. 13 for the most part in terms of operations. However, FIG. 14 uses a pulse drive type voltage for the source SS of the amplifier transistor instead of the DC drive type voltage of FIG. 13. Beside, a pulse is also applied to the row selection line 4-3 for the insensitive pixel row 200 at a timing synchronized with the application of the pulse voltage. Since the operations of FIG. 14 are basically same as those of FIG. 13, the same parts will not be described any further.

According to FIG. 14, as an operation for sampling the threshold voltage of the amplifier transistor 10 in the initial stages of the horizontal blanking period 301 (period a of FIG. 14), a pulse voltage Vs is applied to the source SS. At the same time the row selection line 4-3 for selecting the insensitive pixel row 200 is turned on. As a result, since the source SS of the amplifier transistor 10 is brought to a voltage level higher than that of the substrate voltage Vs, the sampled threshold voltage is the one observed when the source SS of the amplifier transistor 10 shows the voltage of Vs so that a threshold voltage higher than its counterpart of FIG. 13 is sampled. Thus, the source SS is held to the substrate voltage Vs in the subsequent operations including the operation from the selection of the insensitive pixel row 200 to the reading of the integrated gate modulation a is a timing chart illustrating the method of driving the eighth embodiment of infrared sensor and the operation from the selection of a thermoelectric conversion pixel row to the reading of the integrated gate modulation.

With the timing chart of FIG. 14, the operation points of the amplifier transistor 10 to be regulated is increased to make it possible to operate the related elements in a more optimal condition. Consequently, the infrared sensor can operate with a higher sensitivity. In the case of the timing chart of FIG. 13, the operation point of the amplifier transistor 10 is determined by the supply voltage Vd applied to the row selection line by the row selection circuit 40. However, since the supply voltage Vd applied by the row selection circuit 40 also affects the sensitivity of the thermoelectric conversion pixels 1, it will not be allowed to simply optimize the operation of the amplifier transistor 10 depending on the circumstances. In other words, the amplification factor of the amplifier transistor 10 may not necessarily be optimized and hence the sensitivity of the thermoelectric conversion pixels 1 may not necessarily be maximized.

While the signal output from the insensitive pixel 201 is read out and subsequently the signal output from the thermoelectric conversion pixel 1 is read out according to the timing charts of FIGS. 13 and 14, it is also possible to read the signal output from the thermoelectric conversion pixel 1 and subsequently the signal output from the insensitive pixel 201. Furthermore, the timing charts of FIGS. 13 and 14 are designed to determine the difference between the thermoelectric conversion pixel 1 and the insensitive pixel 201, it is also possible to determine the difference of the outputs of two thermoelectric conversion pixels belonging to different rows. Such an arrangement provides an advantage of determining the difference of the outputs of two thermoelectric conversion pixels belonging to adjacently located rows in addition to all the above described advantages. Then, it is possible to provide a so-called edge detecting features, although the feature may be limited to a vertical direction.

(8th Embodiment)

Figure 15:
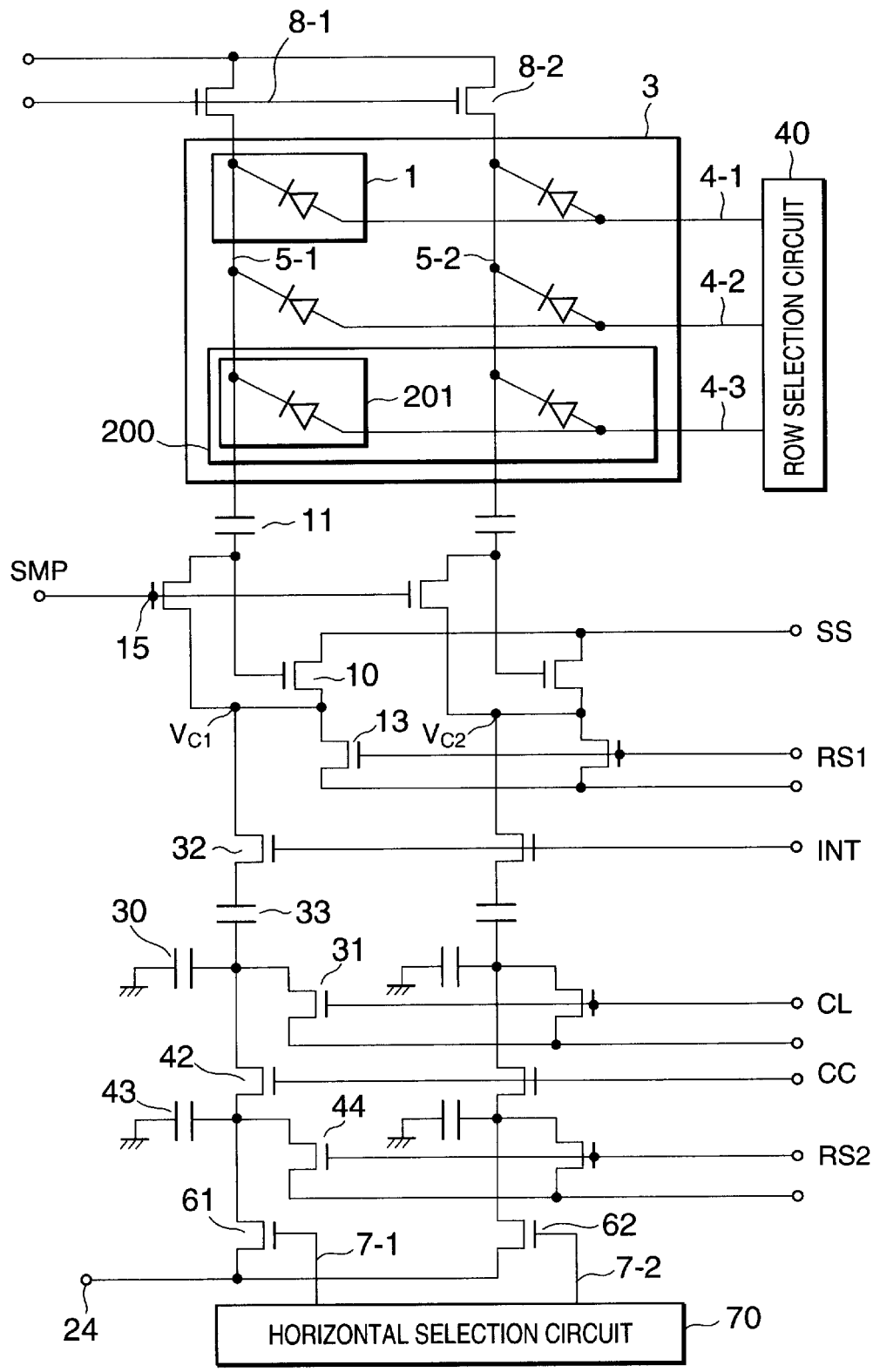
FIG. 15 is a schematic circuit diagram of the eighth embodiment of infrared sensor according to the invention, illustrating its entire configuration.

FIG. 15 is a schematic circuit diagram of the eighth embodiment of infrared sensor according to the invention, illustrating its entire configuration. Pixels are arranged in the form of a 3×2 matrix, where thermoelectric conversion pixels 1 are arranged in the upper two rows and insensitive pixels 201 are arranged in the bottom row to form an insensitive pixel row 200.

The imaging region 3 includes a region where the thermoelectric conversion pixels 1 for converting incident infrared rays into an electric signal are two-dimensionally arranged and a region of the insensitive pixel row 200 of insensitive pixels 201. The configuration of the thermoelectric conversion pixels 1 is same as that described above by referring to FIG. 2. The configuration of the insensitive pixel 201 is similar to FIG. 2 but without having the cavity structure. Thus the insensitive pixel 201 is thermally insensitive. Since the arrangement of FIG. 15 is basically same as that of FIG. 12 illustrating the seventh embodiment, the eighth embodiment will be described only in terms of the difference between it and the seventh embodiment.

The imaging region 3, its peripheral circuits, the gate modulation integration circuit connected thereto by way of the vertical signal lines 5-1, 5-2 and the first coupling capacitors 11 and the circuit for processing the difference of the outcomes of the two signal reading operations are configured same as their respective counterparts of FIG. 12. This embodiment is additionally provided with a sample-and-hold circuit between each of the first storage capacitor 30 and the corresponding horizontal read transistor 14.

Thus, the signal voltage held to each of the first storage capacitors 30 is fed to the corresponding second storage capacitor 43 connected to it by way of a transfer transistor 42. The horizontal selection transistors 61, 62 are adapted to sequentially read the signals stored in the second storage capacitors 43. A second reset transistor 44 is connected to each of the second storage capacitors 43 in order to initialize the voltage of the second storage capacitor 43. By separating the first storage capacitors 30 and the second storage capacitors 43 by means of transfer transistors 42, it is possible to read the integrated gate modulation by using the first storage capacitors 30 under a condition where the signal voltage is held to the second storage capacitors 43.

Figure 16:
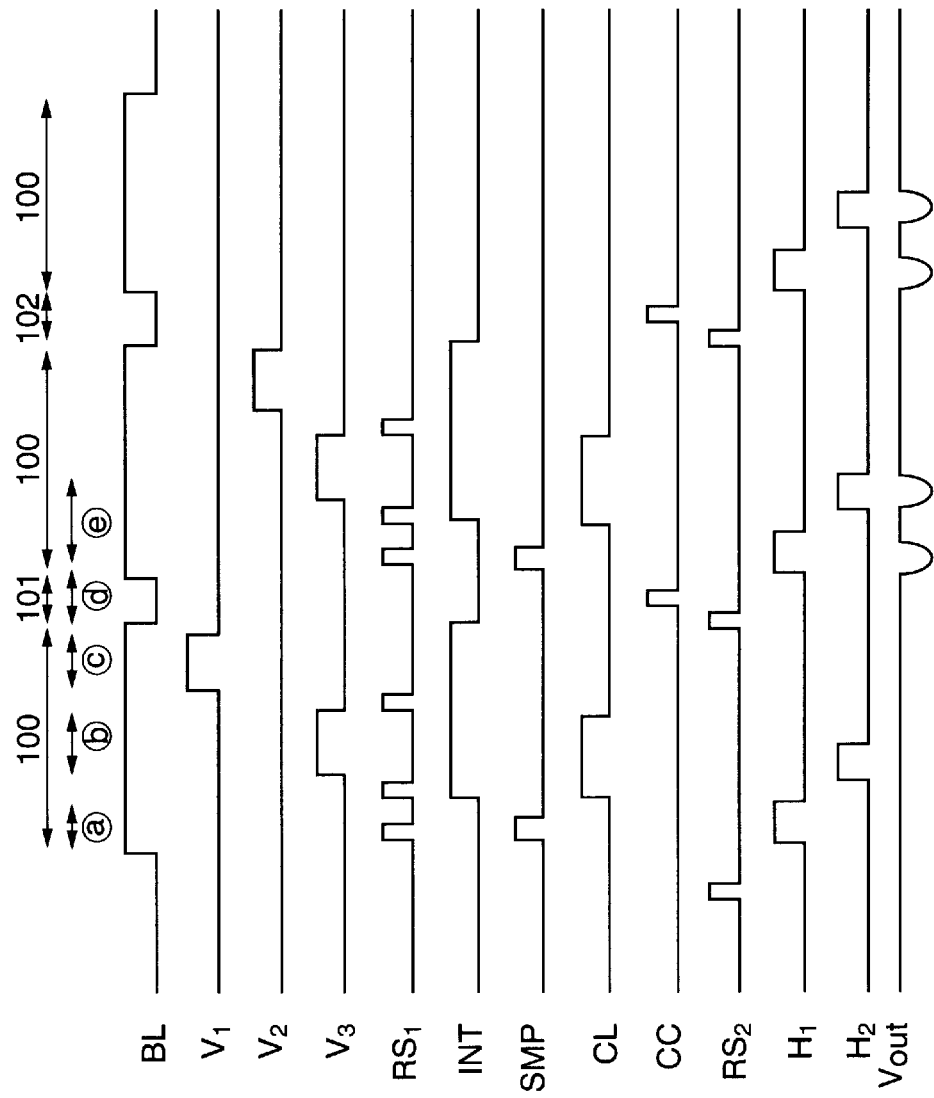
FIG. 16 is a timing chart illustrating a method of driving the eighth embodiment of infrared sensor.

FIG. 16 is a timing chart illustrating the method of driving the eighth embodiment of infrared sensor shown in FIG. 15. The operation of the embodiment will be described below.

The operation of this embodiment differs from that of the seventh embodiment in that the operation of reading the image pickup signal conducted in horizontal blanking periods 101, 102 in the seventh embodiment is conducted in horizontal readout periods 100. Operations similar those in the horizontal blanking period shown in FIG. 13 are conducted in the first horizontal readout period 100. They include an operation of sampling the threshold voltage of the amplifier transistor 10 in each and every horizontal scanning period (period a in FIG. 16), an operation of reading the integrated gate amplification of the dark signal from the insensitive pixel 201 under a condition where the voltage of the first storage capacitor 30 is fixed (period b in FIG. 16) and an operation of reading the integrated gate amplification of the light signal from the thermoelectric conversion pixel of the selected row that is conducted after turning off the clamp transistor 31 for processing differences (period c in FIG. 16). Consequently, the influence of the variance of the threshold value of the amplifier transistor 10 is eliminated from the first storage capacitor 30 and a low noise signal voltage is held by the first storage capacitor 30 under a condition where the 1/f noise of the load MOS transistor 8 and that of the amplifier transistor 10 are lowered as a result of limiting the signal bandwidth in a low frequency zone.

The transfer transistor 42 is held off and the horizontal read transistor 14 is isolated from the first storage transistor 30. While the horizontal selection transistors 61, 62 are sequentially selected by the horizontal pulse from the horizontal selection circuit 70, a reset signal is output to the output section 24.

Only an operation of transferring the signal voltage stored in the first storage capacitor 30 to the second storage capacitor 43 is performed in the horizontal blanking period 101 of this embodiment (period d in FIG. 16). Firstly, the second reset transistor 44 is turned on while the voltage of the second storage capacitor 43 is reset and the second reset transistor 44 is turned off again. Subsequently, the transfer transistor 42 is turned on while the signal charge held to the first storage capacitor 30 is transferred to the second storage capacitor 43 and the transfer transistor 42 is turned off again. The signal voltages transferred to second storage capacitor 43 in this horizontal blanking period 101 are sequentially read out in the next horizontal readout period (period c in FIG. 16).

With this embodiment, it is possible to carry out the operation of reading the integrated gate modulation from the insensitive pixel 201 and that of reading the integrated gate modulation from the thermoelectric conversion pixel 1 in an effective period that takes most of a horizontal scanning period. In other words, the width of the row selection pulse that dominates the above operation of reading the integrated gate modulation can be expanded to a large extent. As a result, it is possible to limit the signal frequency band side at the high frequency side and hence reduce random noise. Therefore, it is possible to realize an even low noise infrared sensor. Of course, this embodiment also provides the advantages of the seventh embodiment including that of reducing 1/f noise that can appear in the load MOS transistor and the amplifier transistor due to the limited signal frequency band at the low frequency band side, that of preventing the phenomenon of vertical shading attributable to sampling the threshold voltage in every horizontal scanning period from occurring and that of eliminating high level reset noise that can appear in the first coupling capacitor 11.

Since the resistance against variances in the manufacturing process is improved by these advantages, infrared sensors can be manufactured at a high yield on a stable basis if the manufacturing process involves variances as in the case of the seventh embodiment.

Figure 17:
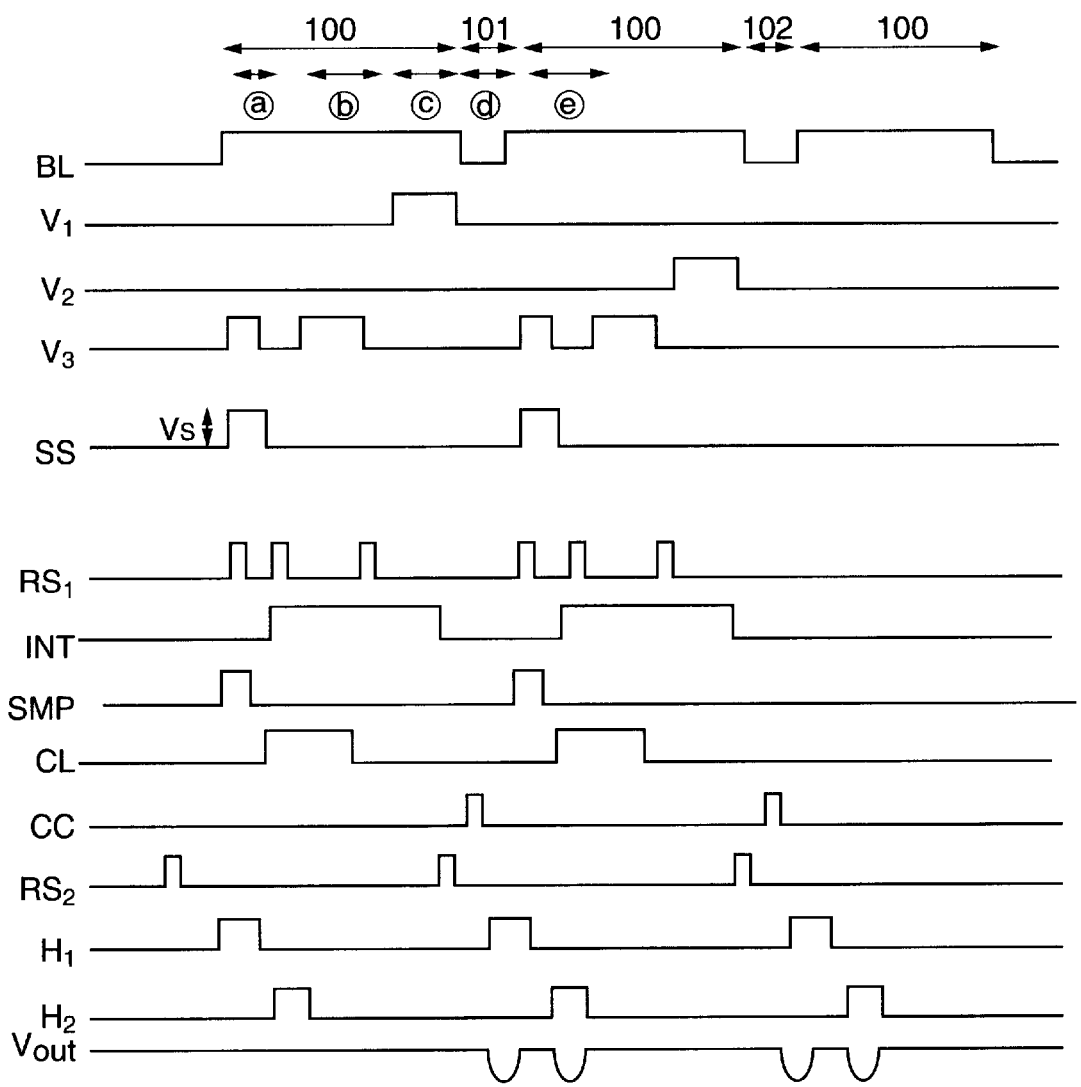
FIG. 17 is also a timing chart illustrating another method of driving the eighth embodiment of infrared sensor.

The infrared sensor of FIG. 15 can be driven by using various timing charts other than the one shown in FIG. 16. FIG. 17 is a timing chart illustrating a technique of driving the source of the amplifier transistor 10 by means of a pulse voltage. The operation using the timing chart of FIG. 17 is basically same as the one using the timing chart of FIG. 16. They are same and identical for the most part. While a DC voltage is used for driving the source of the amplifier transistor 10 in FIG. 16, a pulse voltage is used for driving the source of the amplifier transistor 10 in FIG. 17. Additionally, a pulse is added to the row selection line 4-3 of the insensitive pixel row 200 at the synchronized timing.

Since the operation of FIG. 17 is basically same and identical with that of FIG. 16, the same parts will not be described any further. With the operation of FIG. 17, a pulse voltage Vs is applied to the source SS of the amplifier transistor 10 for the purpose of sampling the threshold voltage of the amplifier transistor 10 in an initial part of the effective period 100 (period a in FIG. 17) and at the same time the row selection line 403 for selecting the insensitive pixel row 200 is turned on. Since the source SS of the amplifier transistor 10 is held to a voltage level higher than that of the substrate voltage Vs for this operation, the sampled threshold voltage is the one obtained when the source SS of the amplifier transistor 10 is at Vs. In other words, a threshold voltage higher than its counterpart of FIG. 16 is sampled. In the operation of reading the integrated gate modulation from the selected insensitive pixel row and that of reading integrated gate modulation form the selected thermoelectric conversion pixel row that take place subsequently, the source SS is set to the substrate voltage Vs.

With the technique of driving the embodiment, the object of regulation of the operation point of the amplifier transistor 10 is expanded to make it possible to drive the related elements in a more optimal state to consequently realize an improved sensitivity for the infrared sensor. More specifically, in the instance of FIG. 16, the operation point of the amplifier transistor 10 is determined by the supply voltage Vd applied to the row selection line by the row selection circuit 40. However, since the supply voltage Vd applied by the row selection circuit 40 can also affect the sensitivity of the thermoelectric conversion pixel 1, it is not allowed to optimize only the operation of the amplifier transistor 10. The amplification factor of the amplifier transistor 10 may not necessarily be optimized and hence the sensitivity of the thermoelectric conversion pixels 1 may not necessarily be maximized.

While the signal output from the insensitive pixel 201 is read out and subsequently the signal output from the thermoelectric conversion pixel 1 is read out according to the timing charts of FIGS. 16 and 17, it is also possible to read the signal output from the thermoelectric conversion pixel 1 and subsequently the signal output from the insensitive pixel 201. Furthermore, the timing charts of FIGS. 16 and 17 are designed to determine the difference between the thermoelectric conversion pixel 1 and the insensitive pixel 201, it is also possible to determine the difference of the outputs of two thermoelectric conversion pixels belonging to different rows. Such an arrangement provides an advantage of determining the difference of the outputs of two thermoelectric conversion pixels belonging to adjacently located rows in addition to all the above described advantages. Then, it is possible to provide a so-called edge detecting features, although the feature may be limited to a vertical direction.

(9th Embodiment)

Figure 18:
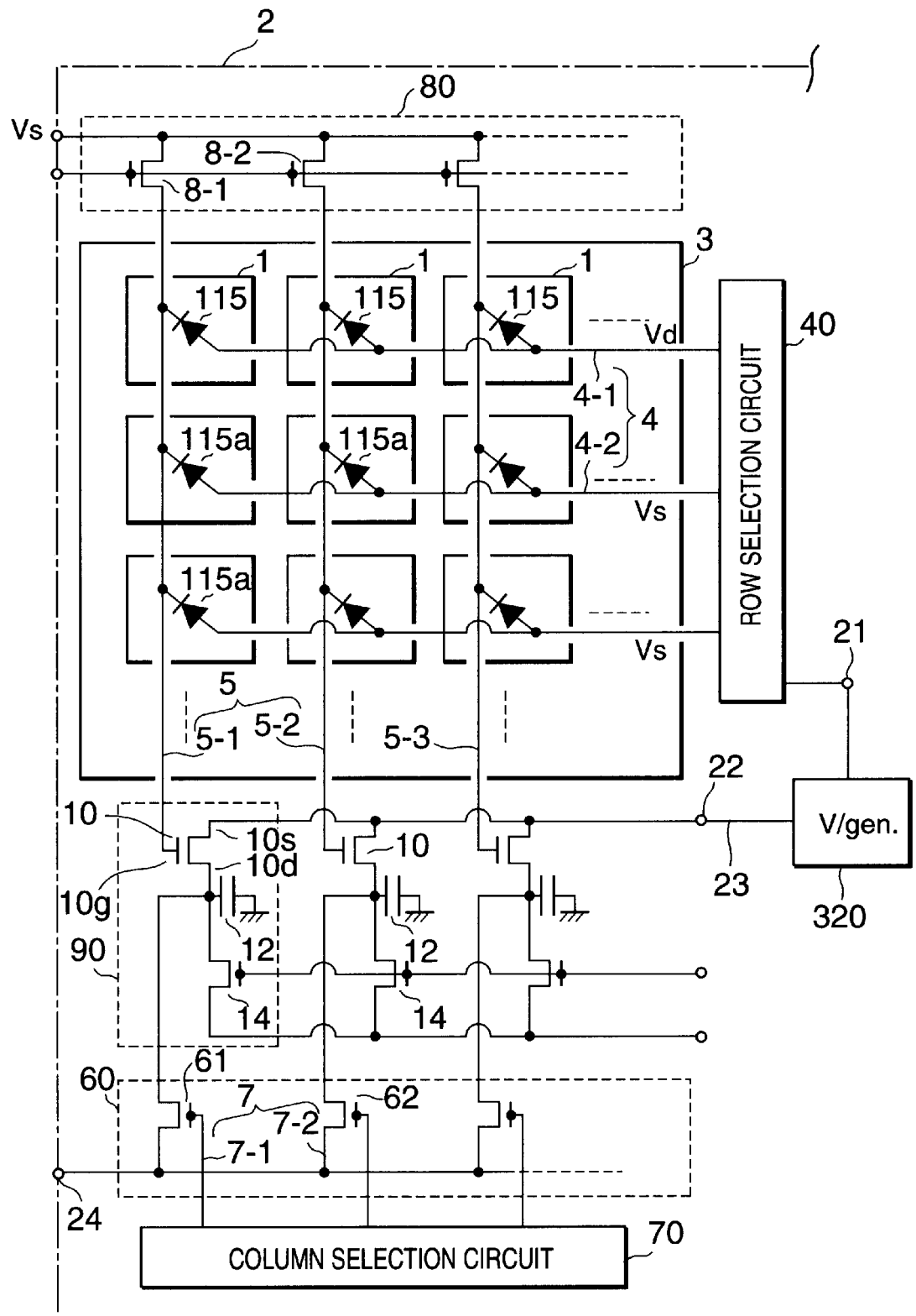
FIG. 18 is a schematic circuit diagram of the ninth and tenth embodiments of infrared sensor according to the invention, illustrating its entire configuration.

FIG. 18 s a schematic circuit diagram of the ninth and tenth embodiments of infrared sensor according to the invention, illustrating its entire configuration. Pixels are arranged in the form of an m×n matrix (where m and n are natural numbers not smaller than 2).

Infrared sensing thermoelectric conversion pixels 1 for converting incident infrared rays into an electric signal are arranged two-dimensionally on a semiconductor substrate 2 to form an imaging region 3. Row selection lines 4 (4-1, 4-2, ... ), or horizontal selection lines, and vertical column selection lines 5 (5-1, 5-2, ... ), or vertical selection lines, are arranged in the imaging region 3. A row selection circuit 40 and a column selection circuit 70 are respectively arranged adjacent to these lines in the row direction and in the column direction of the imaging region 3 and connected to the row selection lines 4 and the column selection lines 7, or the horizontal selection lines.

The row signal lines 5 are connected to respective load MOS transistors 8-1, 8-2 operating as constant current sources 80 for obtaining a pixel output voltage.

In FIG. 18, the substrate voltage:Vs is applied to the sources of the load MOS transistors. Preferably, the source voltage can be regulated.

The supply voltage:Vd is applied to the row selection line 4 selected by the row selection circuit 40, which may be the row selection line 4-1 for example, while Vs is applied to all the row selection lines unselected by the row selection circuit 40. As a result, the regions of pn junctions 115 in the inside of the thermoelectric conversion pixels 1 of the selected row 4-1 are forwardly biased to flow a bias current so that the operation point is determined in each pixel by the temperature of the pn junctions in the inside of the pixel and the forward bias current. Consequently, a pixel signal output voltage is produced in each of the column signal lines 5-1, 5-2, . . . . At this time, the regions of pn junctions 115a, . . . of the pixels not selected by the selection circuit 40 are reversely biased. In other words, the pn junctions in the inside of each pixel have a pixel selecting function.

The voltage generated in the vertical signal lines 5 is a very low voltage. Assume that the ratio of the temperature change of the object of imaging is dTs to the temperature change of the pixel dTd is $5 \times 10^{-3}$. Then, it will be appreciated that the voltage generated in the vertical signal lines 5 is as low as 5 [$\mu$V] form this value and the thermoelectric conversion sensitivity dv/dTd=10 [mV/K] that is obtained when the eight pn junctions of the pixels are connected in series.

Therefore, in order to recognize this temperature difference on the object of imaging, the noise that is generated in the vertical signal lines 5 needs to be made lower than 5 [$\mu$V]. This noise level is as low as about ⅛₀ of the noise of a CMOS sensor that is used for a MOS type visible light image sensor.

A column amplifying circuit 9 is arranged between the signal lines 5-1, 5-1, . . . and the column selection transistor group 60 and the gates 10g of the amplifying MOS transistors 10 of the amplifying circuit 9 are connected to the respective signal lines. A storage capacitor 12 is connected to the drain 10d of each of the MOS transistors 10 for the purpose of integrating and storing the amplified signal current. The storage time to be used for integrating the signal current is determined by the row selection pulse applied to the row selection line 4 from the row selection circuit 40.

The storage capacitor 12 is connected to a reset transistor for resetting the voltage of the storage capacitor 12 and reset after the completion of the operation by the column selection transistor 6 of reading the signal voltage. Terminal 24 in FIG. 18 is an output terminal.

The infrared sensing thermoelectric conversion pixels 1 of this embodiment have a structure as described above by referring to FIG. 2.

Figure 19A:
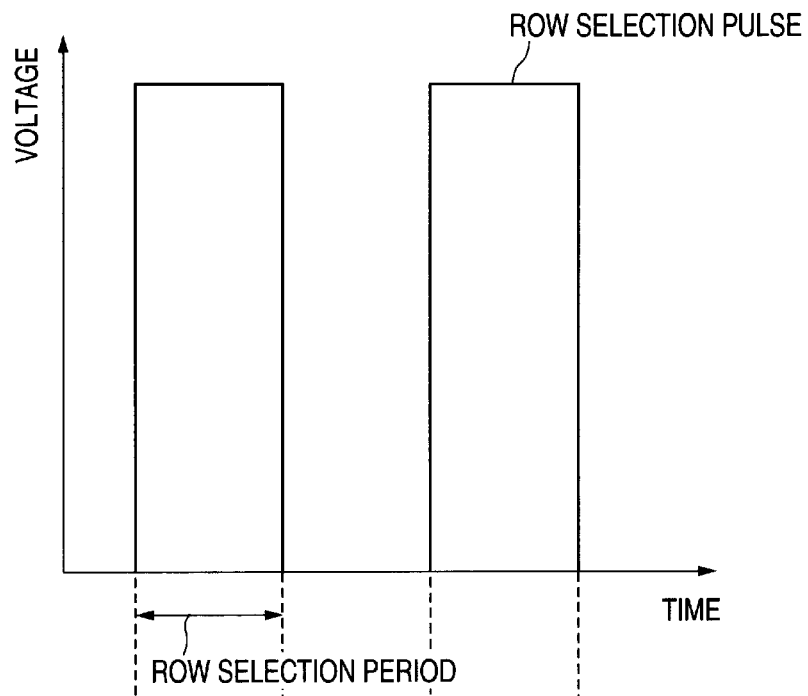
FIG. 19 is a waveform graph, illustrating the ninth embodiment.
Figure 19B:
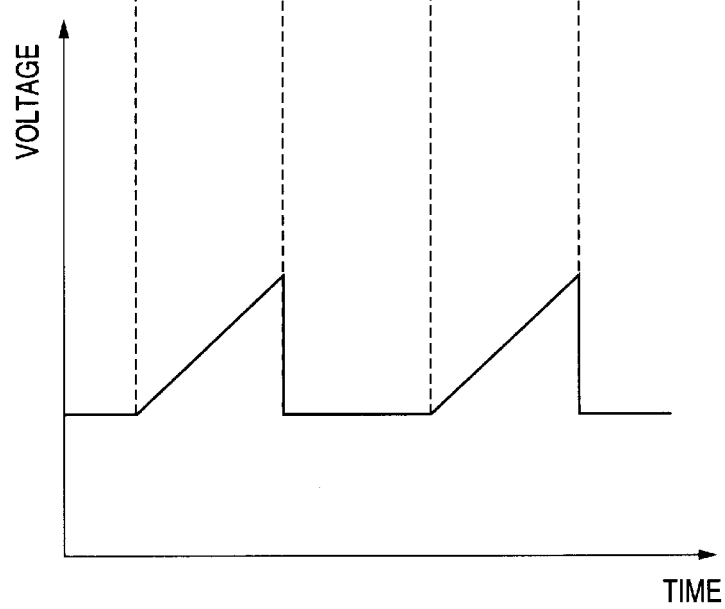

The ninth embodiment of the invention comprises a voltage generator 320 mounted on the semiconductor substrate as shown in FIG. 18. The voltage generator 320 is connected to the row selection circuit 40 by way of terminal 21. As a row selection pulse is input to the voltage generator 320, it generates a ramp waveform voltage that is synchronized with the row selection pulse as shown in FIG. 19 in a row selection period and supplies it to the sources 10s of the amplifier transistors 10 in the column amplifying circuit 9 as source voltage.

Figure 26:
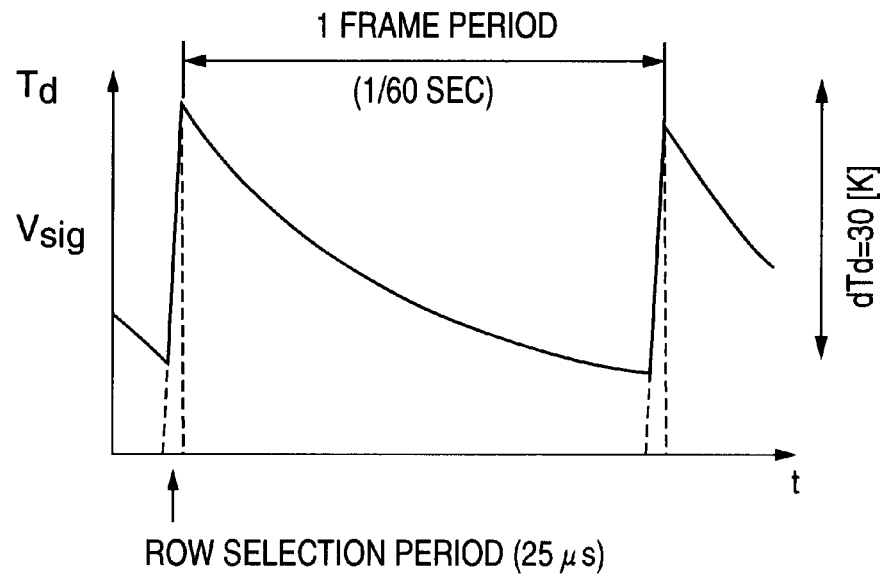
FIG. 26 is a graph illustrating how the pixel temperature Td and the output signal voltage Vsig abruptly change due to self heating during a column selection period and how the pixel temperature is restored in a frame period.
Figure 27:
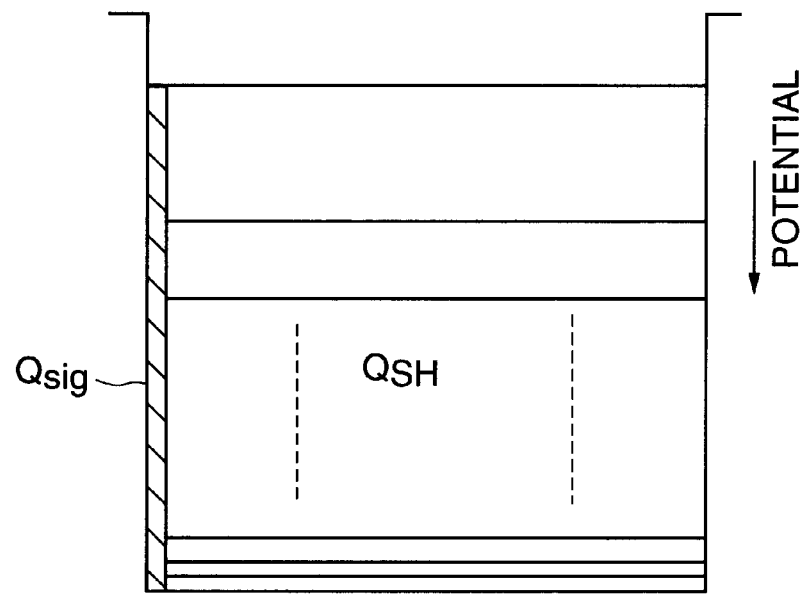
FIG. 27 is a schematic illustration of a potential well, showing how signal charge Qsig and noise charge QSH attributable to self hyper-heating are stored in a storage capacitor in the column amplification circuit during a pixel selection period.

FIG. 26 shows the temperature rise due to self heating of a pixel as described earlier. The thermal time constant of this temperature rise is determined by the heat isolation of the thermoelectric conversion pixel 1 and normally has a magnitude of about [ms].

On the other hand, a row selection period is of the order of [$\mu$s] as illustrated in FIG. 26 and hence very short if compared with the thermal time constant. Therefore, linear approximation can be allowed with a wide margin during a row selection period. Thus, the voltage attributable to self heating generated in the column signal line and applied to the gate 10g of the amplifier transistor 10 can be offset by the ramp waveform voltage applied to the source 10s of the amplifier transistor 10 and only the signal of the temperature change due to the incident infrared rays can be amplified.

As a result, it is possible to optimize the operation point of the amplifier transistor 10 and amplify the current of only the signal component by eliminating the self heating component. Thus, it is now possible to improve the gain and random noise attributable to an expanded band will not be increased undesirably. Therefore, it possible to provide an uncooled type infrared sensor that has a broad dynamic range.

(10th Embodiment)

In FIG. 18, a voltage generator 320 for generating a step waveform voltage is mounted on the semiconductor substrate. As a row selection pulse is input from the row selection circuit 40 to the voltage generator 320, it generates a step waveform voltage that is synchronized with the row selection pulse as shown in FIG. 19 and supplies it to the sources 10s of the amplifier transistors 10 in the row amplifying circuit 9 as source voltage, or the second input.

A D/A converter circuit may be used for generating a step waveform voltage. An effect practically same as that of applying a ramp waveform voltage can be obtained when a step waveform voltage is used provided that the number of bits is appropriately selected. Additionally, the use of a step waveform voltage provides an advantage that the waveform line can be regulated finely.

Therefore, as in the case of the ninth embodiment, the voltage attributable to self heating generated in the column signal line and applied to the gate 10g of the amplifier transistor 10 can be offset by the ramp waveform voltage applied to the source 10s of the amplifier transistor 10 and only the signal of the temperature change due to the incident infrared rays can be amplified.

As a result, it is possible to optimize the operation point of the amplifier transistor 10 and amplify the current of only the signal component by eliminating the self heating component. Thus, it is now possible to improve the gain and random noise attributable to an expanded band will not be increased undesirably. Therefore, it possible to provide an uncooled type infrared sensor that has a broad dynamic range.

Figure 20A:
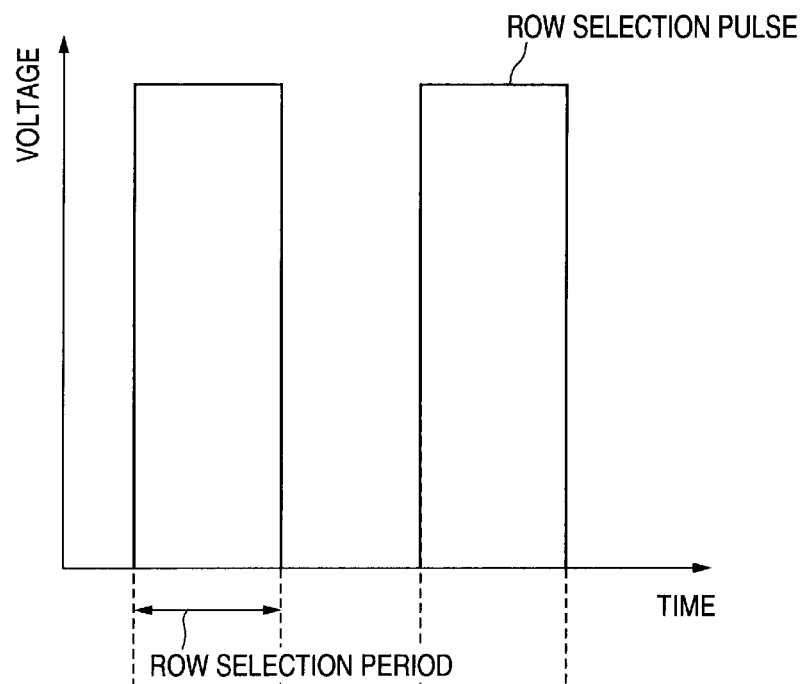
FIG. 20 is a waveform graph, illustrating the tenth embodiment.
Figure 20B:
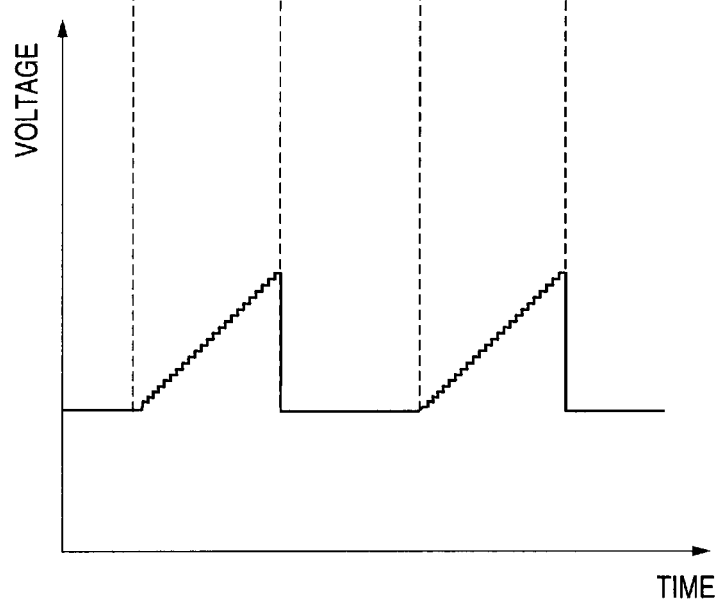

Either of the ninth embodiment or the tenth embodiment can be modified in such a way that the voltage generator 320 is arranged outside the semiconductor substrate. As a row selection pulse is input from the row selection circuit 40 to the voltage generator 320, the voltage generator 320 generates a ramp waveform voltage or a step waveform voltage that is synchronized with the row selection pulse as shown information FIG. 19 or FIG. 20 and supplies it to source voltage input section 22 arranged on the semiconductor substrate by way of wire 23 and further to the sources 10s of the amplifier transistors 10 in the row amplifying circuit 9 as source voltage.

Therefore like the ninth embodiment and the tenth embodiment, the voltage attributable to self heating generated in the column signal line and applied to the gate 10g of the amplifier transistor 10 can be offset by the ramp waveform voltage applied to the source 10s of the amplifier transistor 10 and only the signal of the temperature change due to the incident infrared rays can be amplified.

As a result, it is possible to optimize the operation point of the amplifier transistor 10 and amplify the current of only the signal component by eliminating the self heating component. Thus, it is now possible to improve the gain and random noise attributable to an expanded band will not be increased undesirably. Therefore, it possible to provide an uncooled type infrared sensor that has a broad dynamic range.

(11th Embodiment)

Figure 21:
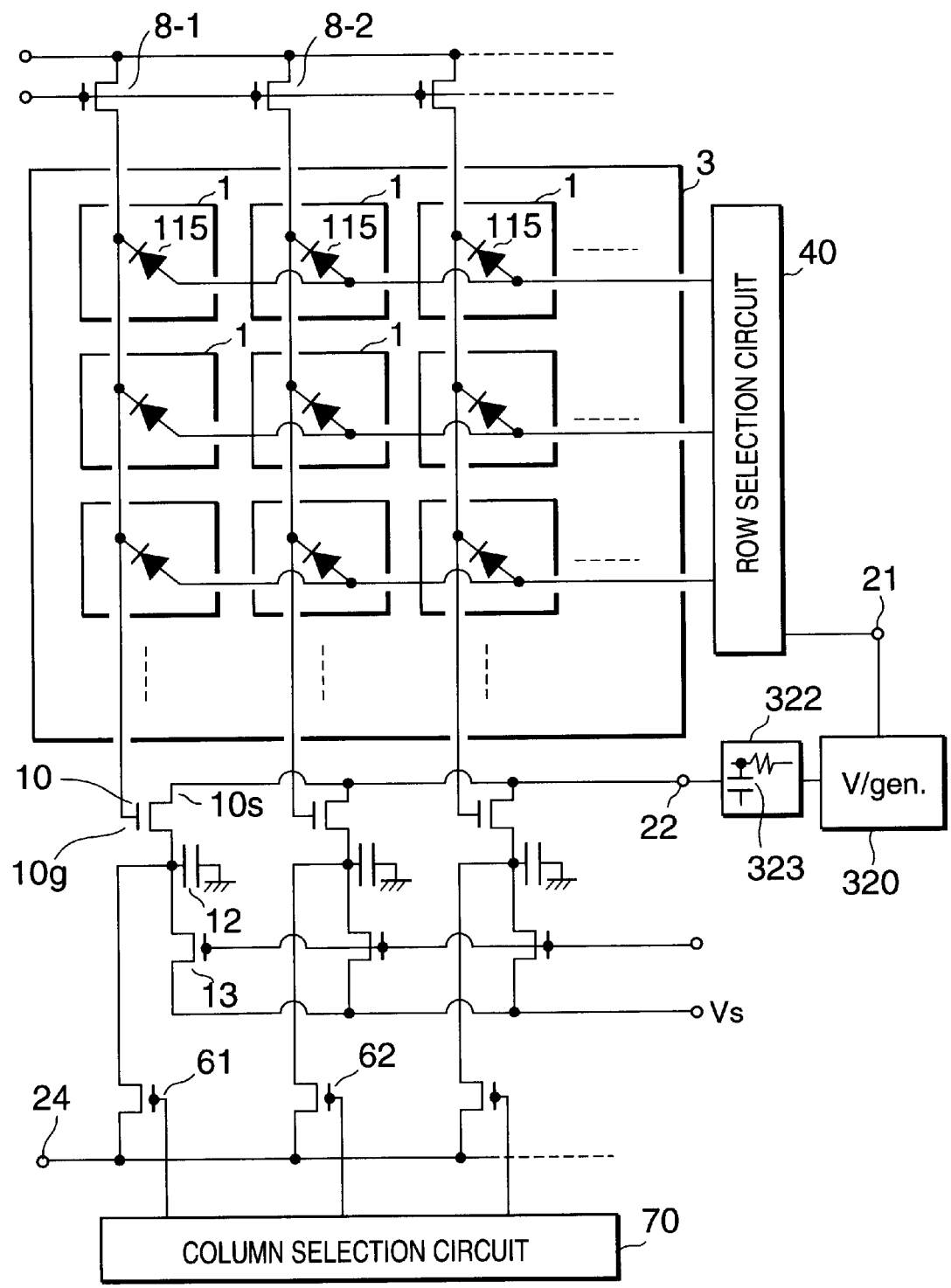
FIG. 21 is a schematic circuit diagram of the eleventh embodiment of infrared sensor according to the invention, illustrating its entire configuration.
Figure 22A:
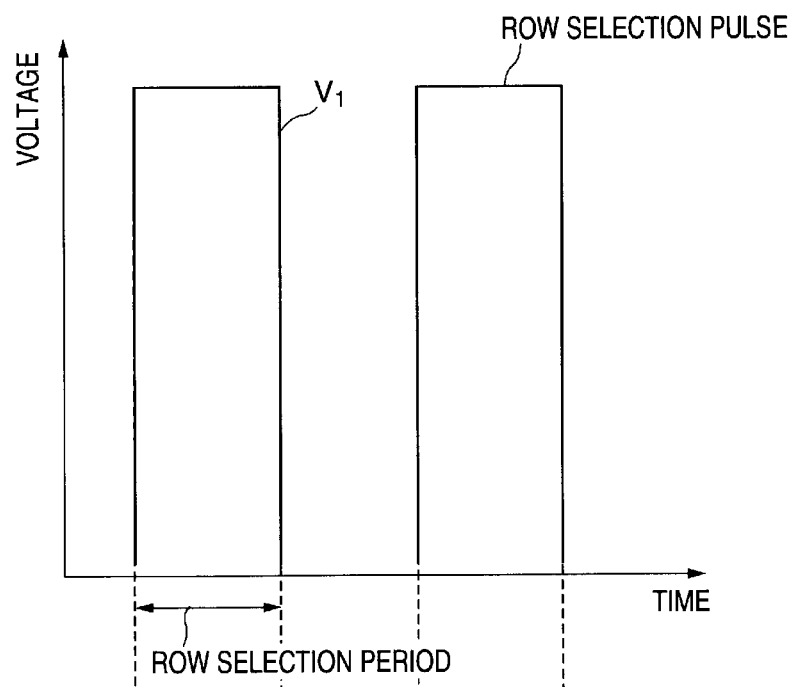
FIG. 22 is a waveform graph, illustrating the eleventh embodiment.
Figure 22B:
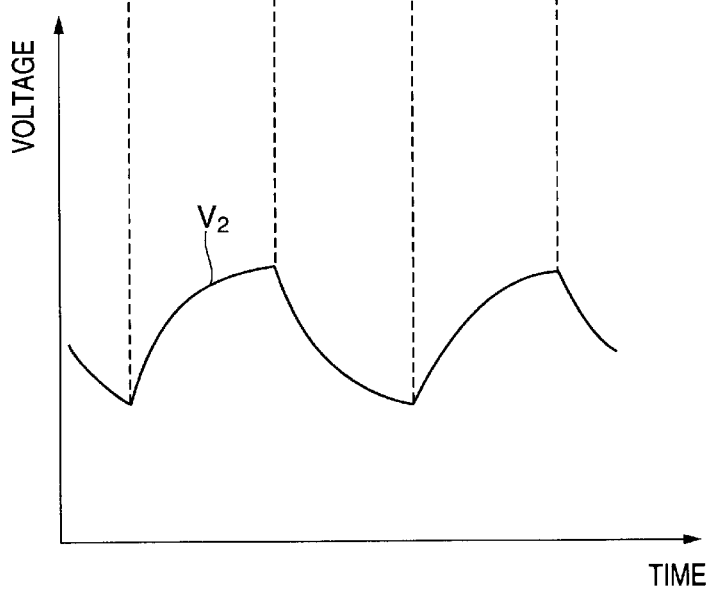

FIGS. 21 and 22 illustrate the eleventh embodiment. In FIGS. 21 and 22, the components same as those of FIG. 18 are denoted respectively by the same reference symbols. The embodiment has a configuration similar to that of FIG. 18 except that the voltage generator 321 is adapted to generate a rectangular waveform voltage and an integration circuit 322 is arranged between the voltage generator 321 and the source voltage input terminals 22 of the amplifier transistors. The voltage generator 321 is mounted on the semiconductor substrate. As a row selection pulse from the row selection circuit 40 is input to the voltage generator 320 by way of the row selection pulse output section 21, the voltage generator 321 generates a rectangular waveform voltage V1 that is synchronized with the row selection pulse ((a) in FIG. 22).

As pointed out above, an integration circuit 322 containing an electric capacitor 323 is arranged on the wire 23 extending between the voltage generator 321 and the amplifier transistor source voltage input section 22 on the semiconductor substrate. As shown in (a) of FIG. 22, as a rectangular waveform voltage V1 that is synchronized with the row selection pulse is input to the integration circuit 322, the latter produces an integrated waveform voltage V2 as shown in (b) of FIG. 22 and supplies it to the amplifier transistor source voltage input section 22 on the sensor chip as source voltage of the amplifier transistor 10 in the column amplifying circuit 9. This integrated ramp waveform can be approximated to the voltage component attributable to self heating that is contained in the input signal of the amplifier transistor. Thus, the voltage component of self heating that is generated on the column signal line and applied to the gate 10g of the amplifier transistor 10 can be offset by the integrated waveform voltage applied to the source of the amplifier transistor 10 as in the case of the first and second embodiments to make it possible to amplify only the signal representing the temperature change due to incident infrared rays.

As a result, it is possible to optimize the operation point of the amplifier transistor 10 and amplify the current of only the signal component by eliminating the self heating component. Thus, it is now possible to improve the gain and random noise attributable to an expanded band will not be increased undesirably.

The eleventh embodiment may be modified in such a way that the voltage generator 321 and the integration circuit 322 are arranged outside the sensor chip.

(12th Embodiment)

Figure 23:
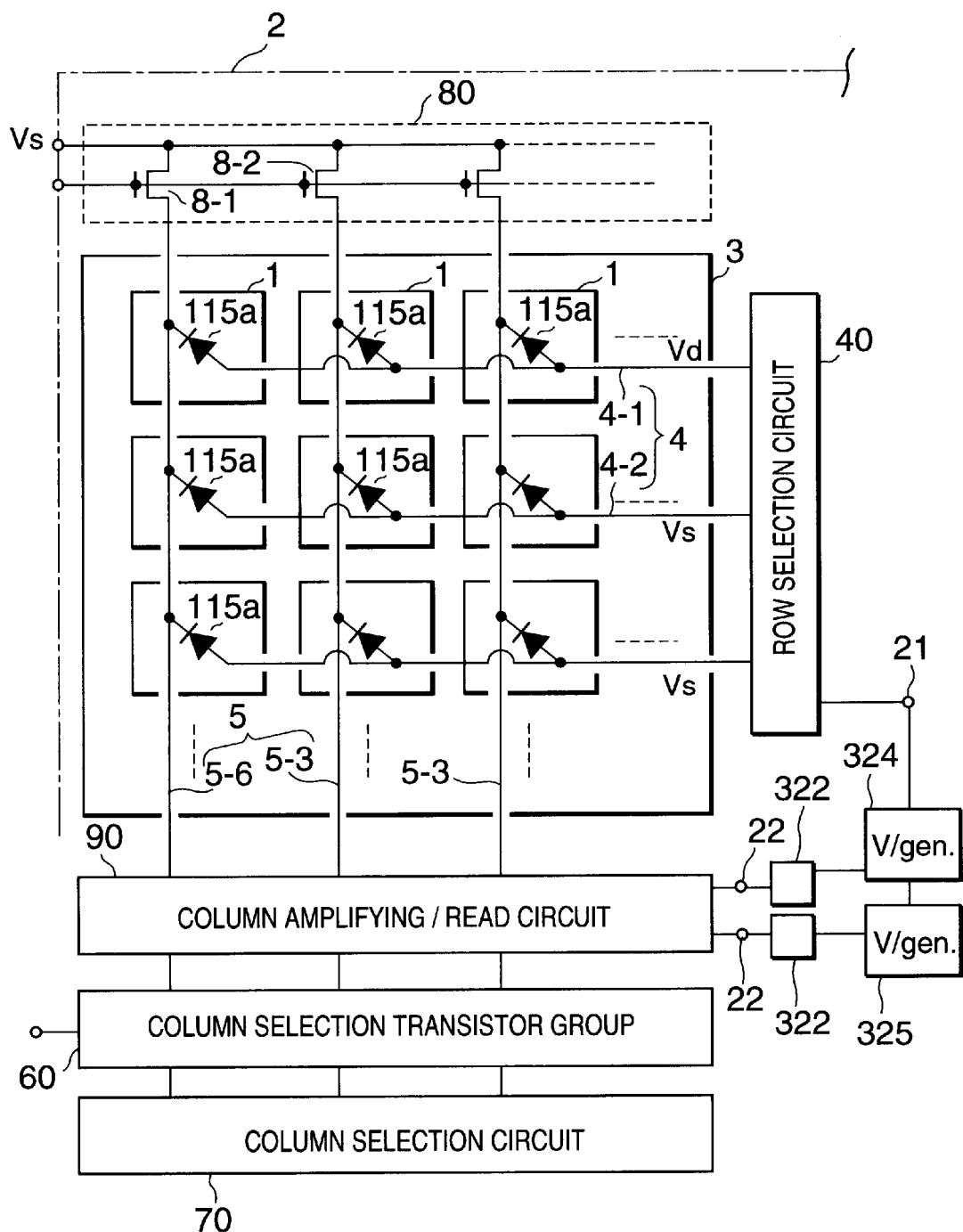
FIG. 23 is a schematic circuit diagram of the twelfth embodiment of infrared sensor according to the invention, illustrating its entire configuration.
Figure 24A:
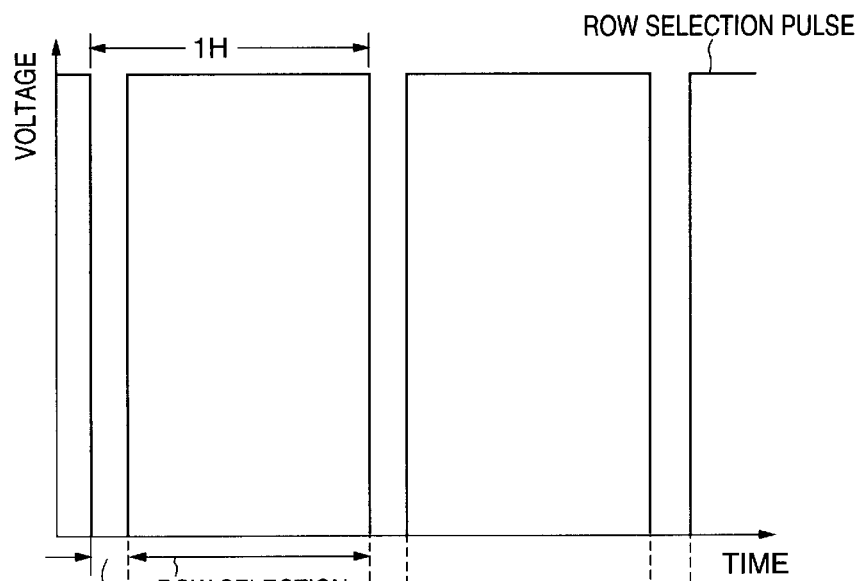
FIG. 24 is a waveform graph, illustrating the twelfth embodiment.
Figure 24B:
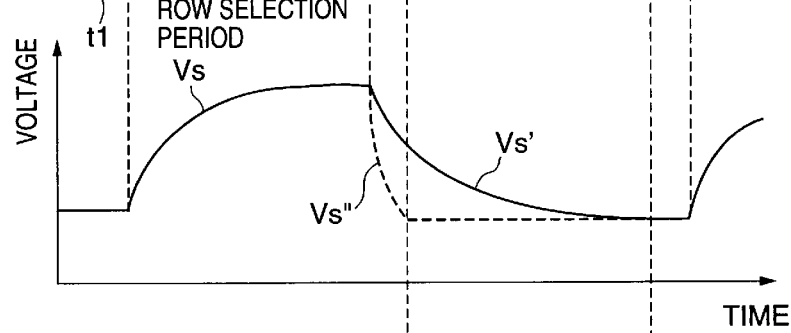
Figure 24C:
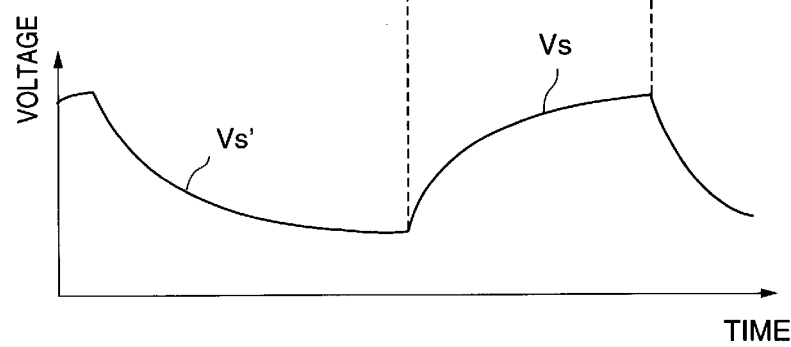

FIGS. 23 and 24 illustrate the twelfth embodiment. In FIGS. 23 and 24, the components same as those of FIG. 18 are denoted respectively by the same reference symbols. In this embodiment, the pixels of every other rows are grouped to form two groups of pixels including a pixel group of odd number rows and that of even number rows and the voltage generator 324 of the first group and the voltage generator 325 of the second generator are operated alternately. In this embodiment, a sample-and-hold (S/H) circuit of a 1H period is added for the purpose of reducing random noise and most of the 1H period is used as row selection period, or a pixel selection period.

It is also possible to provide a circuit configuration and a drive method by which the signal charge accumulated by the column amplifying operation is moved to the added sample-and-hold circuit and output at a timing delayed by a time period corresponding to a row. If such is the case, all the rows are processed by a same circuit and hence the generation of noise of a fixed pattern such as a pattern of horizontal stripes corresponding to every other rows can be effectively suppressed to a great advantage.

When such a drive method is used, the non-selection period t1 of pixel selection pulses of two consecutive rows can be very short depending on the time constant selected on the basis of the added capacity. Then, the voltage Vs' of the amplifier transistor source voltage input section on the semiconductor substrate may not fall sufficiently as compared with a desired fall indicated by Vs" in FIG. 24. The infrared sensor may not operate properly under such a condition.

To bypass the above identified problem, two voltage generators 324, 325 corresponding to the two groups of pixels are provided along with two amplifier transistor source voltage input sections 22 so that every other rows of pixels maybe selected sequentially by switching. With this arrangement of two voltage generators 324, 325, voltages Vs, Vs having respective waveforms shown in (b) and (c) in FIG. 24 are output alternately and, at the same time, the voltages Vs, Vs shown in (b) and (c) are supplied in the inside of the sensor chip as source voltage of the amplifier transistor in the column amplifying/read circuit 90.

Thus, as in the case of the ninth through eleventh embodiments, the voltage attributable to self heating generated in the column signal line and applied to the gate 10g of the amplifier transistor 10 can be offset by the ramp waveform voltage applied to the source 10s of the amplifier transistor 10 and only the signal of the temperature change due to the incident infrared rays can be amplified.

As a result, it is possible to optimize the operation point of the amplifier transistor 10 and amplify the current of only the signal component by eliminating the self heating component. Thus, it is now possible to improve the gain and random noise attributable to an expanded band will not be increased undesirably. Therefore, it possible to provide an uncooled type infrared sensor that has a broad dynamic range.

(13th Embodiment)

The thirteenth embodiment of the invention will be described by referring to FIGS. 25 and 6. The thermoelectric conversion pixels 1 of this embodiment have cavity support structure for supporting pn junction regions as described earlier by referring to FIGS. 2A and 2B and the arrangement of a constant current source 80 realized by using load transistors, a row selection circuit 40, row selection lines 4, column selection circuit 70, column signal lines 5, a column selection transistor group 60 and a column amplifying/read circuit 90 is same as that of FIG. 18 and hence will not be described any further.

Figure 25:
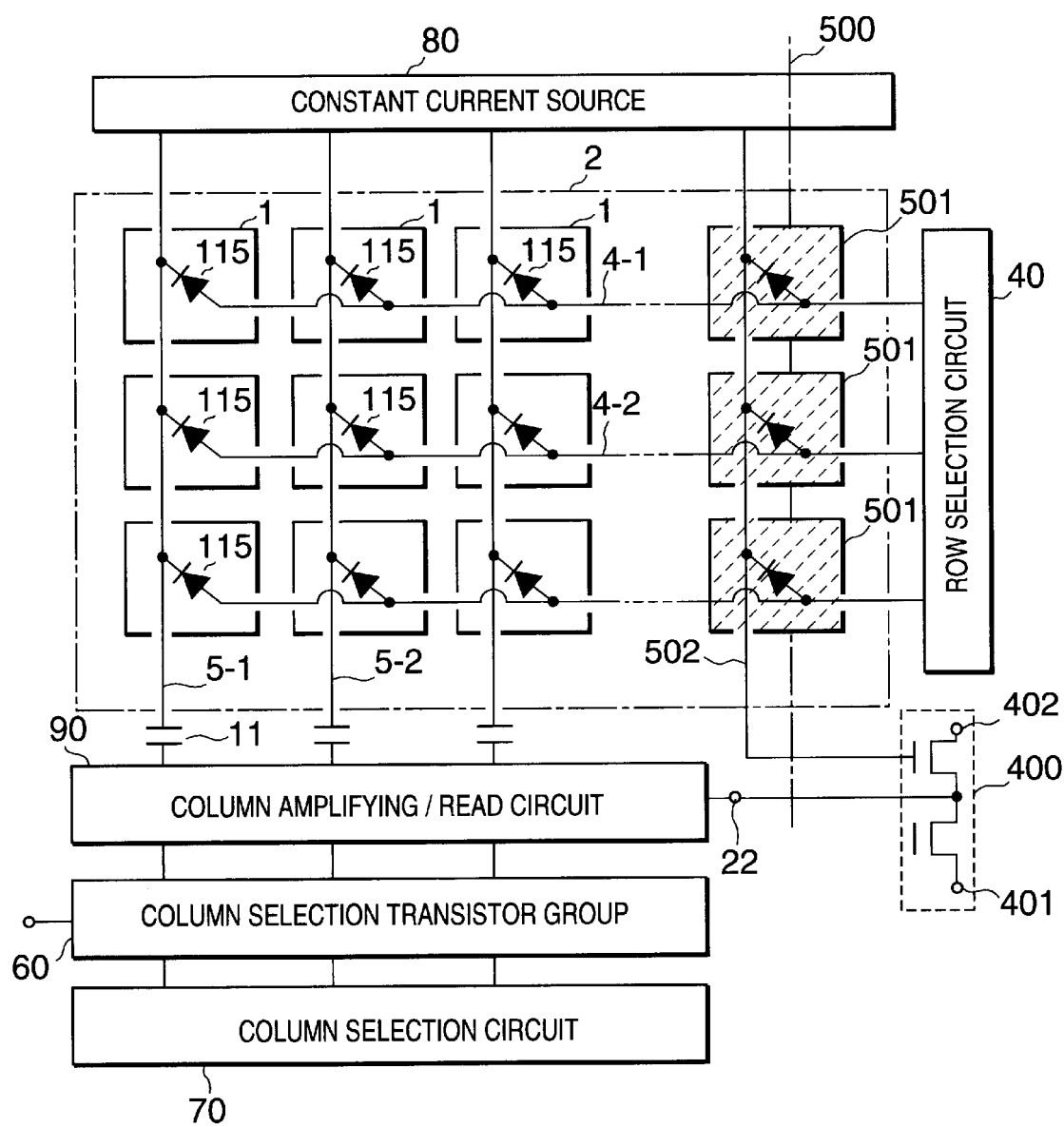
FIG. 25 is a schematic circuit diagram of the thirteenth embodiment of infrared sensor according to the invention, illustrating its configuration.

In this embodiment, a thermally isolated insensitive pixel column 500 is provided as the last column as shown in FIG. 25 in such a way that each row is provided with a thermally isolated insensitive pixel 501 having a structure same as the one illustrated in FIG. 6. Note that each thermally isolated insensitive pixel 501 has a structure same as the pixel 201 illustrated in FIG. 6. In the thermally isolated insensitive pixel 501, incident infrared rays are reflected by the infrared reflection layer 130 and no temperature change occurs if the pixel is stricken by infrared ray so that it only outputs a self heating signal that is generated when it is selected to the column signal line 502. The column amplifying read circuit 90 is connected to the column signal lines by way of a respective coupling capacitors 11.

With this arrangement, it is possible to obtain the output of the thermally isolated insensitive pixel row 500 by way of the column signal line and the coupling capacitor 11 and supply it as source voltage to the source of the amplifier transistors 19 in the column amplifying read circuit 90 (see FIG. 18) by way of a source follower circuit 400 as shown in FIG. 25.

As for the regulation of operation point, the operation point of each pixel can be optimized by regulating the voltages of the terminals 401, 402 of the source follower circuit. Therefore, as in the case of the 9th through the 12th embodiments, the voltage attributable to self heating that is generated in the column signal line 5 outputting a signal can be accurately offset by applying the waveform voltage of the column signal line to the source input section 22 of the amplifier transistors 10 and only the signal of the temperature change due to the incident infrared rays can be amplified. Since the voltage component attributable to self heating always show a same profile, the waveform obtained by mounting insensitive pixels on the same semiconductor substrate can be utilized to offset the voltage component.

As a result, it is possible to optimize the operation point of the amplifier transistor 10 and amplify the current of only the signal component by eliminating the self heating component. Thus, it is now possible to improve the gain and random noise attributable to an expanded band will not be increased undesirably. Therefore, it possible to provide an uncooled type infrared sensor that has a broad dynamic range.

While the use of a single source follower circuit 400 is described above by referring to FIG. 25, it may be replaced by a plurality of source follower circuits 400 if necessary.

Additionally, the circuit 400 is not limited to a source follower circuit and may be replaced by any appropriate circuit that provides the same effect without affecting the output voltage of the column signal line of the thermally isolated insensitive pixel row.

The present invention is described above in terms of the use of a column amplifying circuit comprising a single amplifier MOS transistor using the gate for the first input and the surface for the second input as output signal amplifier. The use of such an amplifying circuit is advantageous from the manufacturing viewpoint because the circuit has a simple configuration. However, other amplifying circuit such as a differential amplifier may alternatively be used so long as it is of the two inputs type.

The thermoelectric conversion pixels of the present invention are described in terms of those having pn junctions. However, the present invention is not limited thereto. For example, the present invention is also applicable to an infrared sensor comprising thermoelectric conversion pixels realized by using a bolometer typically made of vanadium oxide.

The present invention is by no means limited to the above described embodiments. The pixel arrangement may be modified in various different ways so long as they are arranged in an m×n matrix. The thermoelectric conversion pixels are not limited to the structure illustrated in FIGS. 2A and 2B and may be modified appropriately. In other words, any arrangement realized by arranging infrared absorption means for absorbing incident infrared rays and transforming them into heat, thermoelectric means for transforming the heat generated by the infrared absorption means into an electric signal, pixel selection means for selecting a pixel from which the pixel output signal obtained by the thermoelectric conversion means is read and output means for outputting the pixel output signal from the thermoelectric conversion pixel selected by the pixel selection means on a semiconductor substrate falls within the scope of the present invention. Additionally, elements adapted to transform infrared rays directly into an electric signal may alternatively be used within the scope of the present invention.

Furthermore, the above described embodiments may be modified in various different ways.

As described above in detail, according to the invention, the signal lines where the pixel output appears and the gates of the amplifier transistors are separated from each other DC-wise by arranging coupling capacitors between them and each frame is made to hold the threshold information of the amplifier transistors of each column in the gates of the amplifier transistors in order to eliminate any variance among the voltage gains of the columns that can be produced as a result of fluctuations of the threshold value of the amplifier transistors, which may vary from column to column. Thus, the influence of fluctuations of the threshold value of each column can be eliminated to make it no longer necessary to provide a margin for the operating voltage region of the storage capacitors for the purpose of coping with such fluctuations and securing a voltage swing of the storage capacitors. Therefore, according to the invention, it is possible to design a large gain for the gate modulation integration circuit so that a highly sensitive uncooled type infrared sensor can be realized. Additionally, the potential of the storage capacitor can be fully exploited for the same reason to make it possible to provide an uncooled type infrared sensor having a wide dynamic range. Furthermore, the influence of self heating attributable to the read current of the thermoelectric conversion section is offset to realize an uncooled type infrared sensor having a wide dynamic range. Finally, since an infrared sensor according to the present invention is highly resistant to fluctuations in the manufacturing process, infrared sensors can be manufactured at a high yield on a stable basis.

What is claimed is:

1. An infrared sensor comprising:

an imaging region containing thermoelectric conversion pixels arranged two-dimensionally in the form of a matrix of a plurality of row and a plurality of columns on a semiconductor substrate to detect incident infrared rays and at least a row of insensitive pixels having no sensitivity to infrared rays;

a plurality of row selection lines arranged in the column direction in the imaging region;

a plurality of signal lines arranged in the row direction in said imaging region;

a plurality of amplifier transistors connected respectively to said signal lines with respective first coupling capacitors interposed therebetween;

a plurality of sampling transistors arranged respectively between the drains and the gates of said amplifier transistors;

a plurality of first storage capacitors connected respectively to the drains of said amplifier transistors with respective second coupling capacitors interposed therebetween;

a plurality of first reset circuits configured to reset respectively the drain potentials of said amplifier transistors;

a plurality of clamp circuits configured to clamp respectively the voltages of said first storage capacitors; and a plurality of read circuits configured to read respectively the signal charges held in said first storage capacitors.

2. An infrared sensor comprising:

a plurality of thermoelectric conversion pixels arranged in the form of a matrix of a plurality of rows and a plurality of columns and configured to thermoelectrically transform the heat generated as a result of absorbing incident infrared rays and take it out as a change in the resistance;
a plurality of selection lines connected respectively to either the rows or the columns of said thermoelectric conversion pixels;
a plurality of signal lines connected respectively to the other of the columns and the rows of said thermoelectric conversion pixels;
a pixel selection circuit configured to selectively apply a read voltage to said thermoelectric conversion pixels connected to said selection lines and to cause said signal lines to generate respective voltage signals;
an output signal amplifying circuit having a first input section and a second input section, said first input section being connected to said signal lines, and configured to amplify the voltage signal from said thermoelectric conversion pixels; and
a voltage generating circuit connected to the second input section of said output signal amplifying circuit and applying a waveform voltage to cancel or reduce the voltage component contained in said voltage signal, which is due to the resistance change component attributable to the self heating produced in said thermoelectric conversion pixels by said read voltage, in synchronism with said read voltage.

3. An infrared sensor according to claim 2, wherein said output signal amplifying circuit comprises a plurality of output amplifying circuits connected respectively to said plurality of signal lines.

4. An infrared sensor according to claim 2, wherein each of said thermoelectric conversion pixels has a thermoelectric conversion section and a support structure for supporting the thermoelectric conversion section on a cavity structure formed inside said semiconductor substrate and
the support structure includes a wire transmitting a signal from said thermoelectric conversion pixel, said wire being connected to the corresponding one of said selection lines and the corresponding one of said signal lines.

5. An infrared sensor comprising:
thermoelectric conversion pixels arranged two-dimensionally on a semiconductor substrate, each having an infrared absorbing section configured to absorb incident infrared rays and convert them into heat and a thermoelectric conversion section configured to convert the temperature change produced by the heat generated in the infrared absorbing section into an electric signal;
a pixel selection circuit connected to said thermoelectric conversion pixels to select one of said thermoelectric conversion pixels to be used for reading a signal from it;
a pixel signal read circuit configured to read the signal from the thermoelectric conversion pixel selected by said pixel selection circuit;
an output circuit configured to output said signal read by said pixel signal read circuit;
said pixel signal read circuit including an amplifying circuit configured to amplify the signal from said thermoelectric conversion pixel, said amplifying circuit having a MOS transistor and configured to receive the output signal of said thermoelectric conversion pixel through the gate of said MOS transistor as voltage signal; and a voltage applying circuit configured to apply a ramp waveform voltage or a step waveform voltage synchronized with pixel selection of said pixel selection circuit to the source of said MOS transistor to suppress the increase of a voltage between the gate and source of said MOS transistor.

6. An infrared sensor according to claim 5, wherein said voltage applying circuit comprises a voltage generator generating a ramp waveform voltage or a step waveform voltage synchronized with the pixel selection pulse from said pixel selection circuit, said voltage generator being formed on said semiconductor substrate.

7. An infrared sensor according to claim 5, wherein said voltage applying circuit comprises a voltage generator generating a ramp waveform voltage or a step waveform voltage synchronized with the pixel selection pulse from said pixel selection circuit, said voltage generator being provided outside said semiconductor substrate.

8. An infrared sensor according to claim 5, wherein said pixel selection circuit has a pixel selection pulse output terminal and a voltage generator generating a rectangular voltage in synchronism with the pulse output, said voltage generator being provided outside the semiconductor substrate;
the rectangular voltage output from the voltage generator being input to said source;
an integration circuit having at least an electric capacitor being added to the current path between the output terminal of said voltage generator and said source.

9. An infrared sensor according to claim 8, wherein said pixel selection circuit has a plurality of voltage generators are provided.

10. An infrared sensor comprising:
thermoelectric conversion pixels arranged two-dimensionally in a plurality of rows and a plurality of columns on a semiconductor substrate, each having an infrared absorbing section configured to absorb incident infrared rays and to convert them into heat, a thermoelectric conversion section configured to convert the temperature change produced by the heat generated in the infrared absorbing section into an electric signal and a support structure for supporting said infrared absorbing section and said thermoelectric conversion section on a cavity structure formed inside said semiconductor substrate, said support structure containing at least a wire transmitting a signal from said thermoelectric conversion section, said wire being connected to a corresponding row selection line and a corresponding column signal line;
a pixel selection circuit configured to apply a pixel selection pulse to each of said row selection lines to select at least one of said thermoelectric conversion pixels;
a pixel signal read circuit configured to read the signal from said thermoelectric conversion pixel selected by the pixel selection circuit through said corresponding column signal line; and
an output circuit configured to output said signal read by said pixel signal read circuit;
said pixel signal read circuit including a MOS transistor amplifying the signal from said thermoelectric conversion pixel;
said amplifying circuit including a circuit for conducting current modulation by applying at least the signal from said thermoelectric conversion pixel to the gate of said MOS transistor as voltage signal;

each row including at least a thermally isolated insensitive pixel having no photo sensitivity to infrared rays and supported on said cavity structure by said support structure on said semiconductor substrate, said thermally isolated insensitive pixels being arranged in the form of an insensitive pixel column, a voltage referring to a voltage generated in the column signal line of said insensitive pixel column being inputted to the source of said MOS transistor.

11. An infrared sensor according to claim 10, further comprising:

at least a one step source follower circuit configured to receive a reference voltage generated from one of said thermally isolated insensitive pixels to the input thereof, the output of said source follower circuit being input to the source of said MOS transistor.

12. An infrared sensor according to claim 10, wherein each of said thermally isolated insensitive pixels comprises an infrared reflection layer formed on the surface of the infrared absorbing section of a thermoelectric conversion pixel.

* * * * *